US011296198B2

(12) United States Patent
Huang et al.

(10) Patent No.: US 11,296,198 B2
(45) Date of Patent: Apr. 5, 2022

(54) SEMICONDUCTOR STRUCTURE WITH BARRIER LAYER AND METHOD FOR FORMING THE SAME

(71) Applicant: Taiwan Semiconductor Manufacturing Co., Ltd., Hsinchu (TW)

(72) Inventors: Shih-Wen Huang, Tainan (TW); Chung-Ting Ko, Kaohsiung (TW); Hong-Hsien Ke, Changhua County (TW); Chia-Hui Lin, Taichung (TW); Tai-Chun Huang, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/838,160

(22) Filed: Apr. 2, 2020

(65) Prior Publication Data

US 2020/0235214 A1 Jul. 23, 2020

Related U.S. Application Data

(62) Division of application No. 15/992,619, filed on May 30, 2018, now Pat. No. 10,629,693.
(Continued)

(51) Int. Cl.
*H01L 29/417* (2006.01)
*H01L 29/78* (2006.01)
(Continued)

(52) U.S. Cl.
CPC .... *H01L 29/41791* (2013.01); *H01L 21/0217* (2013.01); *H01L 21/0234* (2013.01);
(Continued)

(58) Field of Classification Search
CPC ......... H01L 29/41791; H01L 21/31116; H01L 21/0217; H01L 21/02343; H01L 29/41766;
(Continued)

(56) References Cited

U.S. PATENT DOCUMENTS 8,772,109 B2 7/2014 Colinge
8,785,285 B2 7/2014 Tsai et al.
(Continued)

*Primary Examiner* — Julia Slutsker
(74) *Attorney, Agent, or Firm* — Birch, Stewart, Kolasch & Birch, LLP

(57) ABSTRACT

A method for forming a semiconductor structure is provided. The method includes forming a gate structure over a fin structure, forming a source/drain structure in the fin structure and adjacent to the gate structure, forming a dielectric layer over the gate structure and the source/drain structure, and forming an opening in the dielectric layer to expose the source/drain structure. The method further includes depositing a barrier layer lining a sidewall surface of the opening and a top surface of the source/drain structure. The method further includes etching a portion of the barrier layer to expose the source/drain structure. The method further includes depositing a glue layer covering the sidewall surface of the opening and the source/drain structure in the opening. The method further includes forming a contact structure filling the opening in the dielectric layer. The contact structure is surrounded by the glue layer.

20 Claims, 14 Drawing Sheets

Related U.S. Application Data

(60) Provisional application No. 62/587,564, filed on Nov. 17, 2017.

(51) Int. Cl.
*H01L 29/08* (2006.01)
*H01L 29/45* (2006.01)
*H01L 21/768* (2006.01)
*H01L 21/02* (2006.01)
*H01L 29/66* (2006.01)
*H01L 21/8234* (2006.01)
*H01L 21/311* (2006.01)
*H01L 21/3115* (2006.01)

(52) U.S. Cl.
CPC .. *H01L 21/02063* (2013.01); *H01L 21/02321* (2013.01); *H01L 21/02343* (2013.01); *H01L 21/3115* (2013.01); *H01L 21/31111* (2013.01); *H01L 21/31116* (2013.01); *H01L 21/76802* (2013.01); *H01L 21/76831* (2013.01); *H01L 21/76877* (2013.01); *H01L 21/823431* (2013.01); *H01L 21/823475* (2013.01); *H01L 29/0847* (2013.01); *H01L 29/41766* (2013.01); *H01L 29/45* (2013.01); *H01L 29/66795* (2013.01); *H01L 29/7851* (2013.01); *H01L 29/665* (2013.01); *H01L 29/66545* (2013.01); *H01L 29/7848* (2013.01)

(58) Field of Classification Search
CPC .......... H01L 21/02321; H01L 21/0234; H01L 29/66795; H01L 21/823475; H01L 29/7848; H01L 29/665; H01L 29/66545; H01L 27/0886; H01L 29/785; H01L 23/485; H01L 21/76826; H01L 21/76895
See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2013/0049219 A1* | 2/2013 | Tsai | H01L 21/28512 257/774 |
| 2014/0256153 A1* | 9/2014 | Grill | H01L 21/0217 438/762 |
| 2016/0049362 A1* | 2/2016 | Lin | H01L 21/76897 257/751 |
| 2016/0071799 A1* | 3/2016 | Hsieh | H01L 21/28518 257/288 |
| 2016/0233164 A1* | 8/2016 | Choi | H01L 29/785 |

* cited by examiner

SEMICONDUCTOR STRUCTURE WITH BARRIER LAYER AND METHOD FOR FORMING THE SAME

CROSS REFERENCE TO RELATED APPLICATIONS

This application is a divisional application of U.S. patent application Ser. No. 15/992,619 (U.S. Pub. No. US 2019/0157405 A1), filed on May 30, 2018, which claims the benefit of U.S. Provisional Application No. 62/587,564, filed on Nov. 17, 2017, the entirety of which are incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

However, since feature sizes continue to decrease, fabrication processes continue to become more difficult to perform. Therefore, it is a challenge to form a reliable semiconductor structure including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
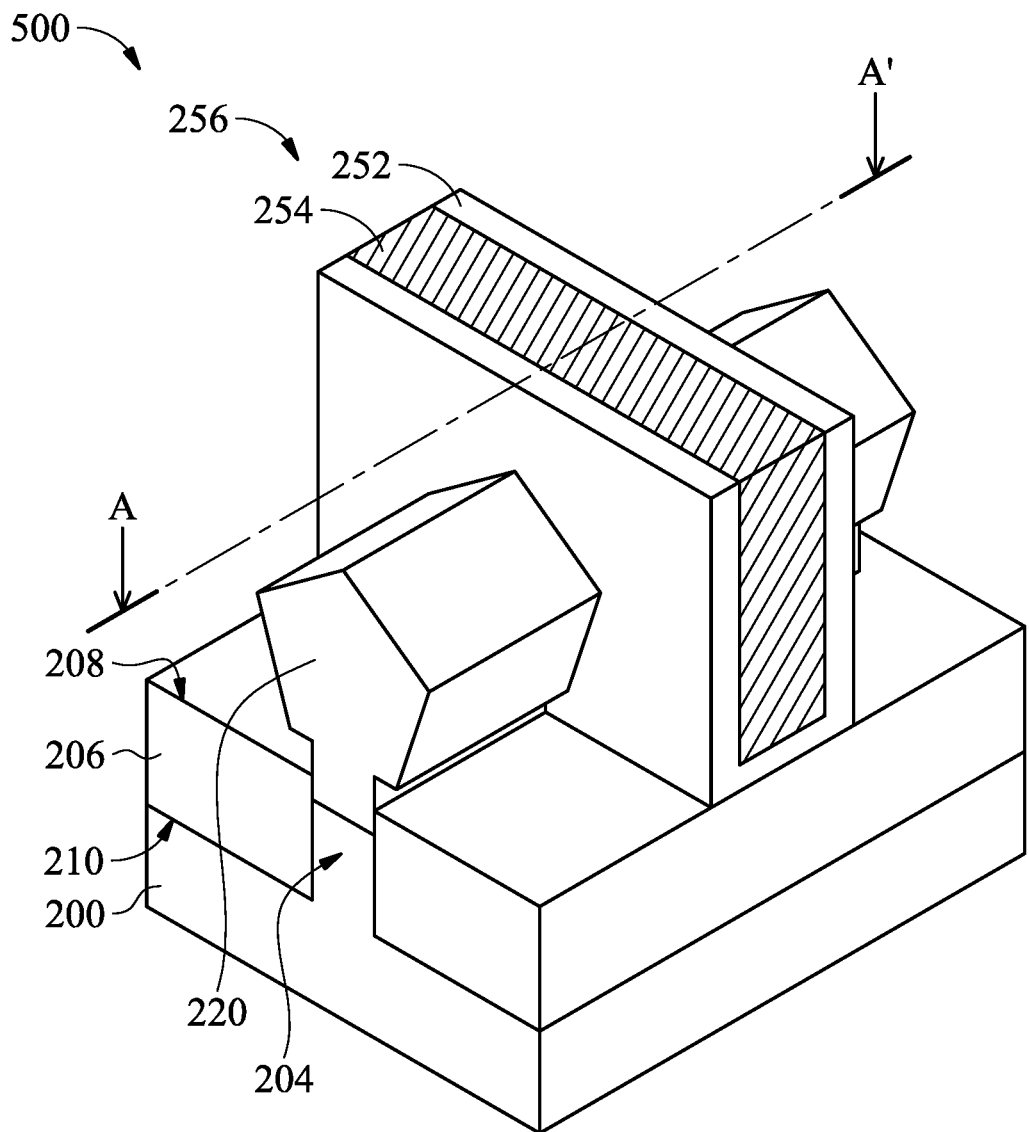
FIG. 1 is a three-dimensional view of an example simplified fin field effect transistor (FinFET) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 illustrates a three-dimensional (3D) view of an example of a simplified fin field effect transistor (FinFET) 500 in accordance with some embodiments. Other aspects not illustrated in or described with respect to FIG. 1 may become apparent from the following figures and description. The FinFET 500 includes a fin structure 204 on a substrate 200. The substrate 200 includes isolation regions 206, and the fin structure 204 protrudes above a top surface 208 of the isolation regions 206. In addition, the fin structure 204 may be formed between the neighboring isolation regions 206. A gate structure 256 including a gate dielectric layer 252 and a gate electrode layer 254 is positioned over the fin structure 204. The gate dielectric layer 252 is positioned along sidewalls and over the top surface of the fin structure 204, and a gate electrode layer 254 is positioned over the gate dielectric layer 252. Source/drain structures 220 are disposed in opposing regions of the fin structure 204 with respect to the gate dielectric layer 252 and the gate electrode layer 254. FIG. 1 further illustrates a reference cross-section A-A' that is used for later figures. The cross-section A-A' may be in a plane along, e.g., a channel in the fin structure 204 between the opposing source/drain structures 220.

The source/drain structures 220 may be shared between various transistors, for example. In some examples, the source/drain structures 220 may be connected or coupled to other FinFETs such that the FinFETs are implemented as one functional transistor. For example, if neighboring (e.g., as opposed to opposing) source/drain regions are electrically connected, such as through coalescing the regions by epitaxial growth, one functional transistor may be implemented. Other configurations in other examples may implement other numbers of functional transistors.

FIGS. 2A-2F are cross-sectional views along line A-A' of FIG. 1 showing various stages of a process for forming a semiconductor structure 600A, in accordance with some embodiments. It should be noted that the cross-sectional views of the semiconductor structure are taken along the longitudinal direction (the channel length direction of a FinFET) of a fin structure (e.g. The fin structure 204) of the semiconductor structure.

In some embodiments, a gate-replacement (gate-last) process is employed to fabricate the semiconductor structures 600A, such as a fin field effect transistor (FinFET) (e.g. FinFETs 500A and 500B).

Figure 2A:
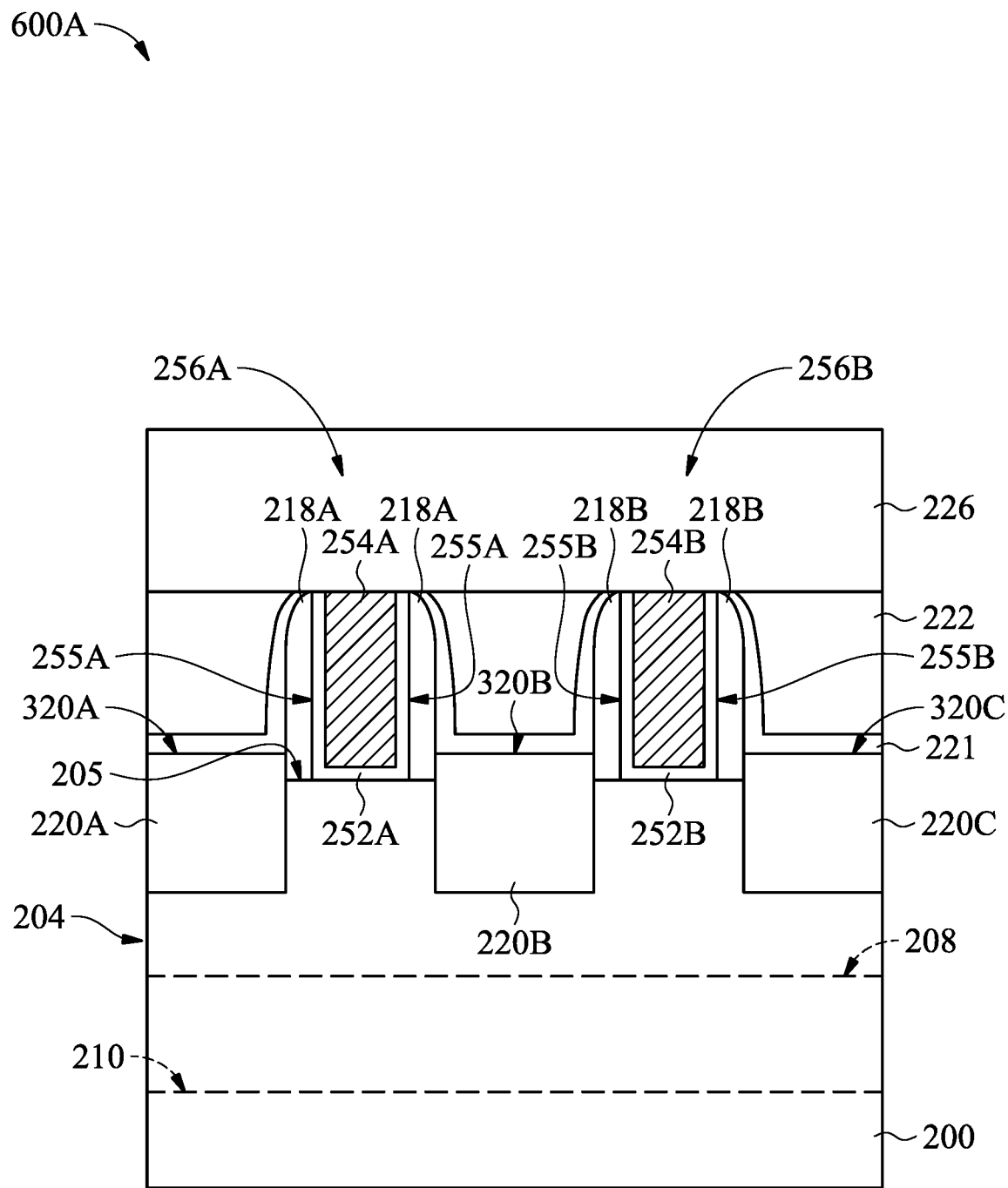
FIGS. 2A-2F are cross-sectional views along line A-A' of FIG. 1 showing various stages of a process for forming a semiconductor structure, in accordance with some embodiments.

As shown in FIG. 2A, the substrate 200 including the fin structure 204 is received. In some embodiments, the substrate 200 may be a semiconductor substrate, such as a bulk semiconductor, a semiconductor-on-insulator (SOI) substrate, or the like, which may be doped (e.g. with a P-type or an N-type dopant) or undoped. The substrate 200 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 200 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the fin structure 204 is formed by performing a patterning process on the substrate 200. The fin structure 204 may be surrounded by trenches (e.g. The isolation regions 206 in FIG. 1) formed in the substrate 200 by the patterning process. The isolation regions (e.g. The isolation regions 206 in FIG. 1; shallow trench isolation (STI) structures) may be formed on a bottom surface 210 of the trenches. A lower portion of the fin structure 204 is surrounded by the isolation structures, and an upper portion of the fin structure 204 protrudes from a top surface 208 of each of the isolation structures.

After the isolation regions are formed, dummy gate structures (not shown) are formed over a top surface 205 of the fin structure 204. In addition, hard mask layers are formed on the dummy gate structures. In some embodiments, the dummy gate structures cover respective channel regions of the resulting finFETs (e.g. The FinFETs 500A and 500B) on the fin structure 204. In some embodiments, the dummy gate structures cover the top surface 205 and sidewalls of the fin structure 204, and extend over the isolation region and the substrate 200 outside the fin structure 204. In some embodiments, each of the dummy gate structures includes a gate dielectric (not shown) and a gate electrode (not shown) formed over the gate dielectric.

Afterwards, gate spacers 218A and 218B are formed on opposite sidewalls of the dummy gate structure and over the fin structure 204, as shown in FIG. 2A in accordance with some embodiments. The gate spacers 218A and 218B may include a single layer structure or a multi-layer structure. The gate spacer spacers 218A and 218B may be made of low dielectric constant (low-k) materials (e.g. k<5), such as silicon oxide, silicon nitride, silicon oxynitride, silicon carbide, silicon carbonitride, another suitable material, or a combination thereof. In some embodiments, the gate spacers 218A and 218B are formed by a deposition process and a subsequent etching process. The deposition process may include a chemical vapor deposition (CVD) process, a physical vapor deposition (PVD) process, a spin-on process, another applicable process, or a combination thereof. The etching process may include a dry etch process.

After the gate spacers 218A and 218B are formed, source/drain structures 220A, 220B and 220C are formed in portions of the fin structure 204 that is not covered by the dummy gate structures and the gate spacers 218A and 218B, as shown in FIG. 2A in accordance with some embodiments. The source/drain structures 220A, 220B and 220C may be formed in the fin structure 204 and adjacent to the gate spacers 218A and the gate spacers 218B.

In some embodiments, the source/drain structures 220A, 220B and 220C may include a strained material or a stressed material to apply stress to the channel region. For example, the source/drain structures 220 are formed of Ge, SiGe, InAs, InGaAs, InSb, GaAs, GaSb, InAlP, InP, or the like. In some embodiments, the lattice constant of the source/drain structures 220A, 220B and 220C are different from the lattice constant of the fin structure 204. In some embodiments, the source/drain structures 220A, 220B and 220C have a diamond shape.

The source/drain structures 220A, 220B and 220C may be formed by an etching process and a subsequent filling process. The etching process is performed to form recesses (not shown) adjacent the gate spacers 218A and 218B and in the fin structure 204. In some embodiments, the etching process is a dry etching process. In some embodiments, the filling process (not shown) is performed by filling the recesses with one or more strained or stressed semiconductor materials to form the source/drain structures 220A, 220B and 220C. In some embodiments, the filling process includes an epitaxial process, such as a selective epitaxial growth (SEG) process, CVD deposition techniques (e.g. vapor-phase epitaxy (VPE) and/or ultra-high vacuum CVD (UHV-CVD)), molecular beam epitaxy, or another suitable epitaxial process.

After the source/drain structures 220A, 220B and 220C are formed, a contact etch stop layer (CESL) 221 is conformally deposited over the source/drain structures 220A, 220B and 220C and the gate spacers 218A and 218B by a thin film deposition process, as shown in FIG. 2A in accordance with some embodiments. The CESL 221 may serve as an etch stop layer of the subsequent etching process configured to form source/drain contact holes (not shown). In some embodiments, the CESL 221 may be a single layer or multiple layers. The CESL 221 may be made of silicon carbide (SiC), silicon nitride ($Si_xN_y$), silicon carbonitride (SiCN), silicon oxycarbide (SiOC), silicon oxycarbon nitride (SiOCN), silicon oxide (SiOx) or another applicable material. In some embodiments, the CESL 221 has a bi-layer structure which contains different material, for example, a silicon oxide (SiOx) layer formed on a SiC layer. In some embodiments, the CESL 221 is formed by performing a plasma enhanced chemical vapor deposition (CVD) process, a low pressure CVD process, an atomic layer deposition (ALD) process, or another applicable process.

After the CESL 221 is formed, a dielectric layer 222 (such as an inter-layer dielectric (ILD) layer) is formed over the fin structure 204, the dummy gate structures, the gate spacers 218A and 218B, and the source/drain structures 220A, 220B and 220C, as shown in FIG. 1A in accordance with some embodiments. The dielectric layer 222 may be formed over the CESL 221 and may fill gaps between the dummy gate structures 215A and 215B. In some embodiments, the dummy gate structures 215A and 215B are surrounded by the dielectric layer 222.

In some embodiments, a deposition process is performed to form the dielectric layer 222 over the CESL 221. Afterwards, a planarization process is performed to level the top surfaces of CESL 221, the dielectric layer 222, the gate spacers 218A and 218B, and the dummy gate structures.

In some embodiments, the dielectric layer 222 is made of a dielectric material such as silicon oxide, phosphosilicate glass (PSG), borosilicate glass (BSG), boron-doped phosphosilicate glass (BPSG), undoped silicate glass (USG), carbon-doped silicate glass, silicon nitride or silicon oxynitride. In some embodiments, the dielectric layer 222 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, ELK dielectric material is deposited by a plasma enhanced chemical vapor deposition (PECVD) process or by a spin coating process.

In some embodiments, the deposition process of the dielectric layer 222 includes a plasma enhanced chemical vapor deposition (CVD) process, a low pressure CVD process, an atomic layer deposition (ALD) process, flowable CVD (FCVD process), a spin-on coating process, or another applicable process. In some embodiments, the planarization process includes a chemical mechanical polishing (CMP) process, a grinding process, an etching process, another applicable process, or a combination thereof.

After the dielectric layer 222 is formed, metal gate structures 256A and 256B are formed to replace the dummy gate structure by a removal process, a deposition processes and a subsequent planarization process, and as shown in FIG. 2A in accordance with some embodiments. In some embodiments, the metal gate structure 256A surrounded by the gate spacers 218A includes a gate dielectric layer 252A and a gate electrode layer 254A over the gate dielectric layer 252A. Similarly, the metal gate structure 256B surrounded by the gate spacers 218B may include a gate dielectric layer 252B and a gate electrode layer 254B over the gate dielectric layer 252B. In some embodiments, the gate spacers 218A are positioned on opposite sidewall surfaces 255A of the metal gate structure 256A, and the gate spacers 218B are positioned on opposite sidewall surfaces 255B of the metal gate structure 256B.

In some embodiments, the gate dielectric layers 252A and 252B include a single layer or multiple layers. In some embodiments, the gate dielectric layers 252A and 252B have a U-shape from a cross-sectional view or a rectangular shape from a plane view. In some embodiments, the gate dielectric layers 252A and 252B are formed of silicon oxide, silicon nitride, or a high-k dielectric material (k>7.0) including a metal oxide or a silicate of Hf, Al, Zr, La, Mg, Ba, Ti, Pb, or a combination thereof. The formation methods of gate dielectric layers 252A and 252B may include molecular beam deposition (MBD), atomic layer deposition (ALD), plasma enhanced CVD (PECVD), and the like.

In some embodiments, the gate electrode layers 254A and 254B are made of a metal-containing material such as TiN, TaN, TaC, Co, Ru, Al, combinations thereof, or multi-layers thereof, and are formed by a deposition process, such as electroplating, electroless plating, or another suitable method.

In some embodiments, a work function layer (not shown) may be formed in the metal gate structures 256A and 256B. The work function layer may include N-work-function metal or P-work-function metal. The P-type work function layer may include TiN, TaN, Ru, Mo, Al, WN, $ZrSi_2$, $MoSi_2$, $TaSi_2$, $NiSi_2$, WN, another suitable P-type work function material, or a combination thereof. The N-type work function layer may include Ti, Ag, TaAl, TaAlC, TiAlN, TaC, TaCN, TaSiN, Mn, Zr, another suitable N-type work function material, or a combination thereof.

Afterward, a dielectric layer (e.g. an inter-metal dielectric (IMD) layer) 226 is formed over the dielectric layer 222 and the metal gate structures 256A and 256B, as shown in FIG. 2A in accordance with some embodiments. For example, the dielectric layer 226 may be a flowable film formed by a flowable CVD method. In some embodiments, the dielectric layer 226 is formed of a dielectric material such as PSG, BSG, BPSG, USG, or the like, and may be deposited by any suitable method, such as CVD and PECVD.

Figure 2B:
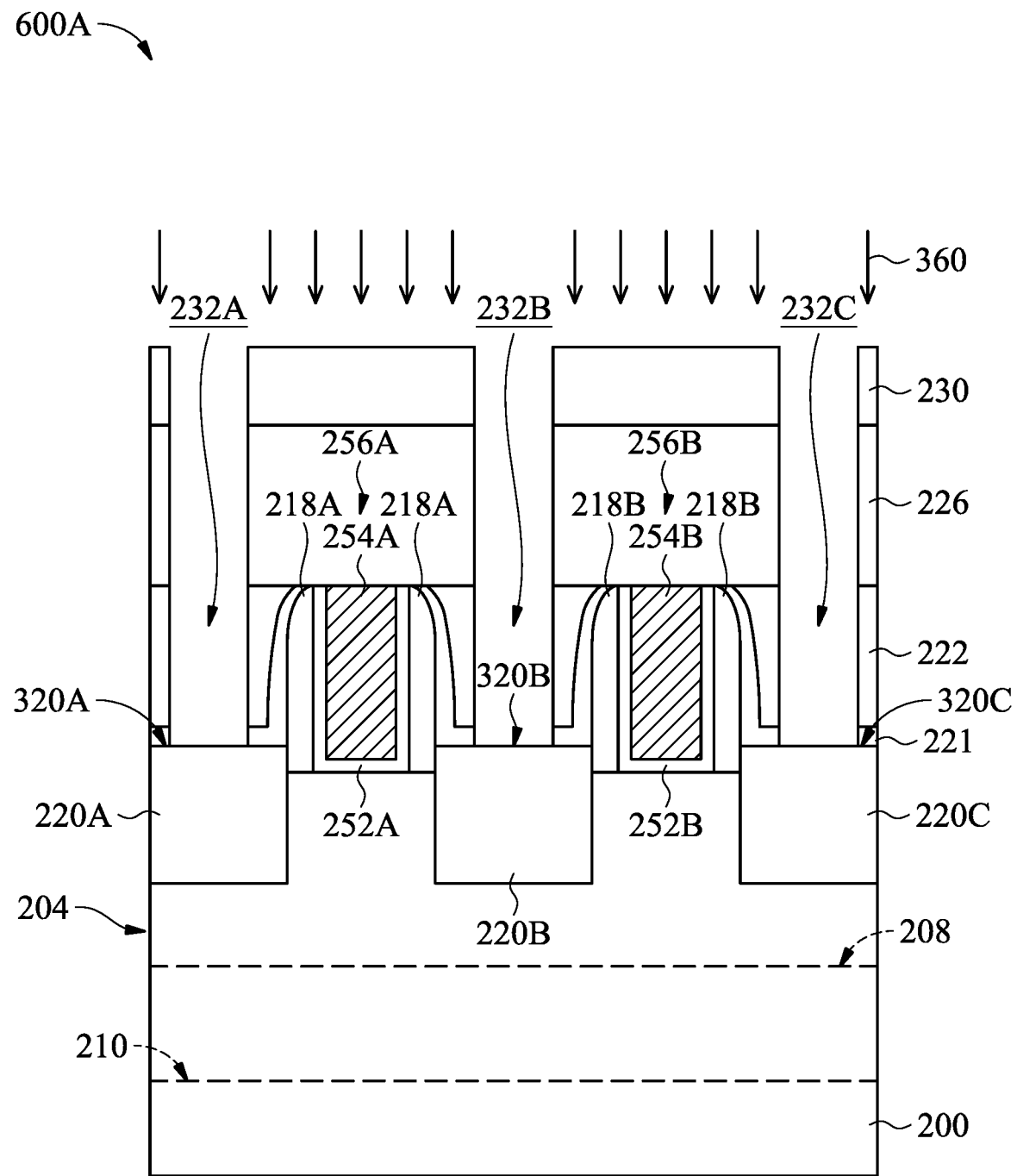

After the dielectric layer 226 is formed, a mask layer 230 is formed over the dielectric layer 226, as shown in FIG. 2B in accordance with some embodiments. The mask layer 230 may have openings directly above to the positions of the source/drain structures 220A, 220B and 220C. The mask layer 230, which may be a photo-sensitive layer such as photoresist, may be formed cover portions of the dielectric layer 226 using a deposition process, such as chemical vapor deposition (CVD), physical vapor deposition (PVD) or spin coating, a photolithography and a patterning processes. The photolithography process may include photoresist coating (e.g. spin-on coating), soft baking, mask aligning, exposure, post-exposure baking, developing the photoresist, rinsing and drying (e.g. hard baking).

Afterward, an etching process 360 is performed to form openings 232A, 232B and 232C in the dielectric layers 222 and 226 to expose the source/drain structures 220A, 220B and 220C, as shown in FIG. 2B in accordance with some embodiments. The etching process 360 is performed to remove portions of the dielectric layers 222 and 226 and the CESL 221 to form the openings 232A, 232B and 232C and to stop on top surfaces 320A, 320B and 320C of the source/drain structures 220A, 220B and 220C are exposed. Therefore, the openings 232A, 232B and 232C are formed passing through the dielectric layers 222 and 226 and the CESL 221 rather than passing through a portion of the source/drain structures 220A, 220B and 220C. In some embodiments, the etching process 360 is a dry etching process. In addition, etching gases used in the etching process 360 include fluorine-containing (F-containing) gases. After the openings 232A, 232B and 232C are formed, the mask layer 230 may be removed by etching or any other suitable method.

Figure 2C:
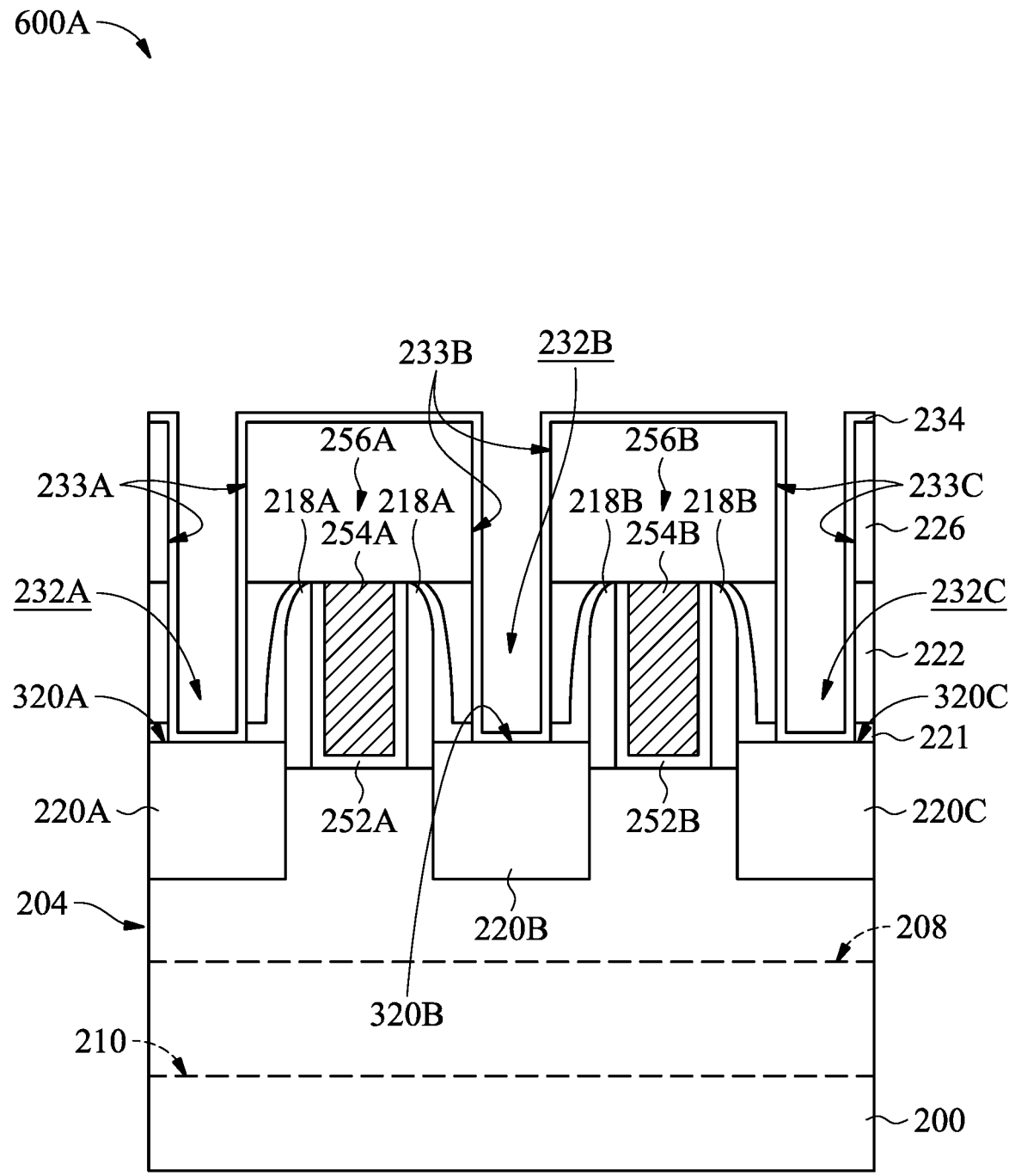

Afterward, a barrier layer 234 is deposited lining a sidewall surface 233A of the opening 232A, a sidewall surface 233B of the opening 232B, a sidewall surface 233C of the opening 232C, the top surface 320A of the source/drain structure 220A, the top surface 320B of the source/drain structure 220B and the top surface 320C of the source/drain structure 220C, as shown in FIG. 2C in accordance with some embodiments. The barrier layer 234 may be conformally formed over the dielectric layers 222 and 226 and the source/drain structures 220A, 220B and 220C.

In some embodiments, the band gap value of the barrier layer 234 is in a range from about 4 eV to about 9 eV. Therefore, the barrier layer 234 with a larger band gap value may have a good insulation ability. For example, the barrier layer 234 may be formed of materials including silicon nitride (e.g. SiN, $Si_2N_3$ and $Si_3N_4$), aluminium oxide ($Al_2O_3$), aluminium fluoride (AlF), aluminium oxyfluoride ($AlOF_x$), silicon-doped zirconium oxide ($SiZrO_x$), silicon-doped hafnium oxide ($SiHfO_x$), hafnium oxide ($HfO_2$), zirconium oxide ($ZrO_2$), silicon oxide (SiOx) or a combination thereof. In some embodiments, the band gap value of the barrier layer 234 is greater than the band gap values of the gate spacers 218A and 218B, the CESL 221. For example, the band gap values of the gate spacers 218A and 218B, the CESL 221 may be in a range from about 3 eV to about 6 eV. Therefore, the barrier layer 234 may have a better insulation ability than the gate spacers 218A and 218B, the CESL 221, and the dielectric layers 222 and 226.

In some embodiments, the barrier layer 234 is formed by a deposition process including a chemical vapor deposition (CVD) process, an atomic layer deposition (ALD) process or a thermal oxidation process. The deposition process is performed using a precursor including $SiH_2Cl_2$, $NH_3$, $SiH_4$, $N_2O$, $Al_2(CH_3)_6$, $H_2O$, $O_3$, $O_2$, $F_2$, or $NF_3$. The deposition process is performed with a radio-frequency (RF) power in a range from about 100 W to about 1000 W. The deposition process is performed at a pressure in a range from about 2 torr to about 9 torr. The deposition process is performed at a temperature in a range from about 300° C. to about 800° C.

Figure 2D:
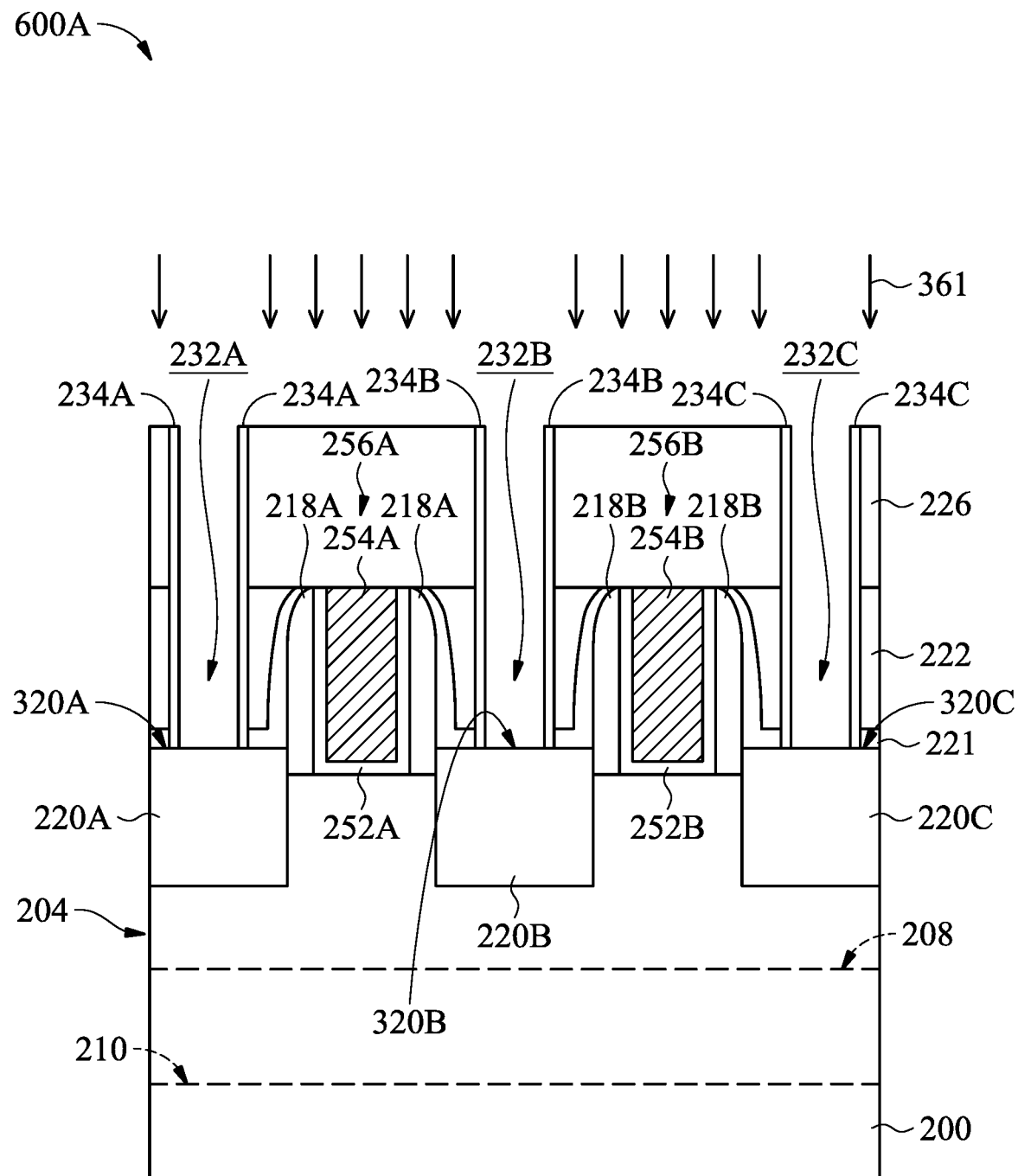

Afterward, a portion of the barrier layer 234 (FIG. 2C) is etched to expose the source/drain structures 220A, 220B and 220C by an etching process 361 as shown in FIG. 2D in accordance with some embodiments. The etching process 361 is performed to remove a portion of the barrier layer 234 above a top surface of the dielectric layer 226 and above the top surfaces 320A, 320B and 320C of the source/drain structures 220A, 220B and 220C and to stop on the source/drain structures 220A, 220B and 220C. For example, when the barrier layer 234 is formed of silicon nitride, the barrier layer 234 may be partially removed and to stop on the source/drain structures 220A, 220B and 220C by tuning the etching selectivity of silicon nitride to silicon (or silicon dioxide) during the etching process 361. A barrier layer 234A is formed on the sidewall surface 233A of the opening 232A, and a barrier layer 234B is formed on the sidewall surface 233B of the opening 232B by performing the etching process 361. In addition, a barrier layer 234C is formed on the sidewall surface 233C of the opening 232C. Furthermore, the top surfaces 320A, 320B and 320C of the source/drain structures 220A, 220B and 220C in the openings 232A, 232B and 238C are exposed after performing the etching process 361.

In some embodiments, the etching process 361 includes a dry etching process or other applicable processes. In some embodiments, etching gases used in the etching process 361 include argon (Ar), hydrofluorocarbon ($C_xH_yF_z$), hydrogen ($H_2$) and fluorocarbon ($C_xF_y$). The etching process 361 may be performed at a temperature in a range from about 30 C to about 100 C. In addition, the etching process 361 may be performed with a radio-frequency (RF) power in a range from about 100 W to about 1000 W.

Figure 2E:
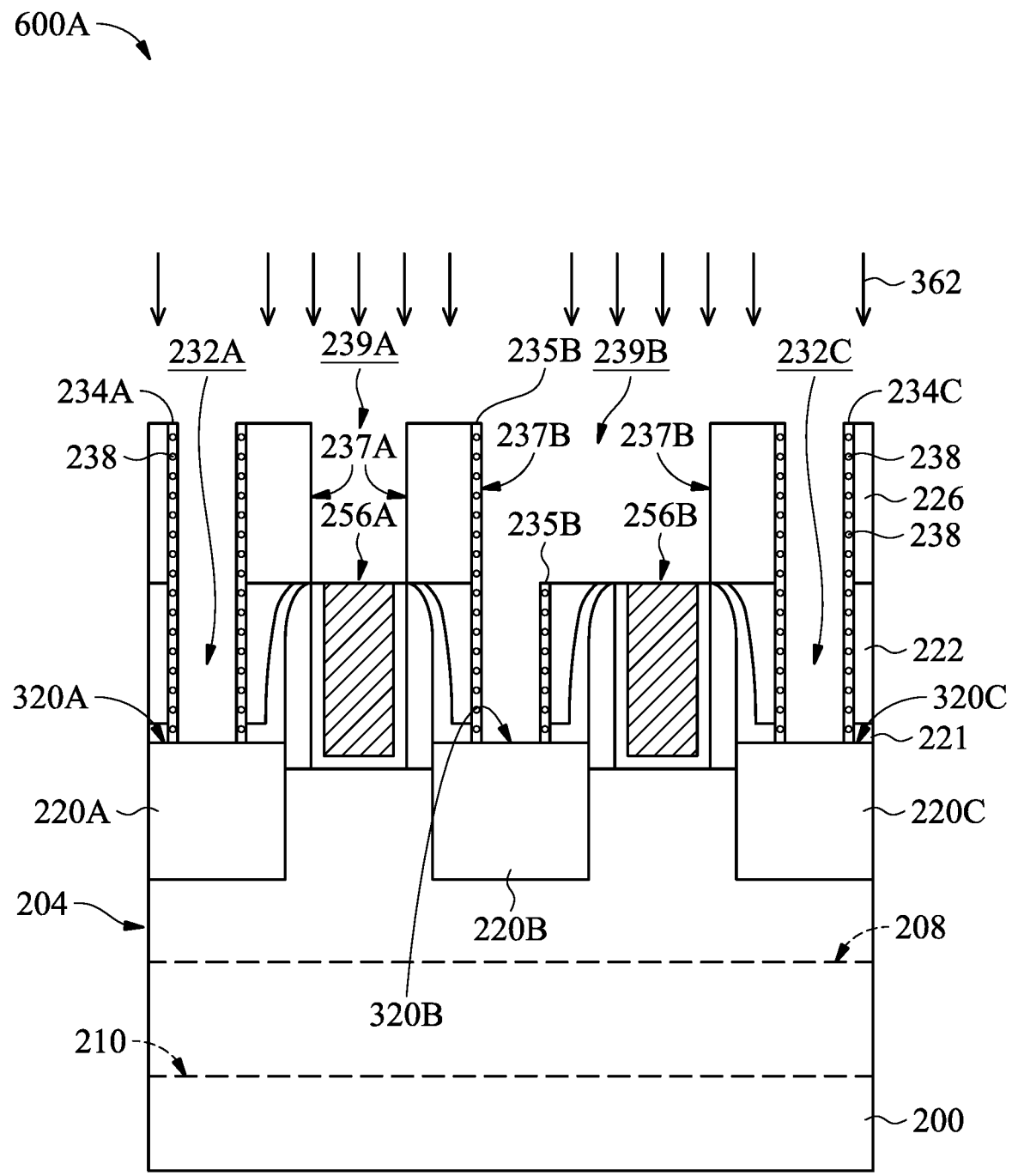

Afterward, a pre-cleaning process 362 is performed on the barrier layers 234A, 234B and 234C (FIG. 2D), as shown in FIG. 2E in accordance with some embodiments. In some embodiments, the pre-cleaning process 362 is performed to clean (remove) the native oxide (not shown) on the sidewalls of the barrier layers 234A, 234B and 234C and the top surfaces 320A, 320B and 320C of the source/drain structures 220A, 220B and 220C (FIG. 1D). In addition, the pre-cleaning process 362 is performed to dope the barrier layers 234A, 234B and 234C with fluorine (F) 238 on sidewalls of the barrier layers 234A, 234B and 234C in the openings 232A, 232B and 232C (FIG. 2D). For example, when the barrier layers 234A, 234B and 234C, which is formed of silicon nitride, and a process gas, which includes hydrofluoric acid (HF), used in the pre-cleaning process 362 and may be formed silicon nitride fluoride ($SiN_xF_x$) on the sidewalls of the barrier layers 234A, 234B and 234C. For example, a concentration of the fluorine (F) 238 in the barrier layers 234A, 234B and 234C is in a range from about 2 at % to about 4 at %. The barrier layers 234A, 234B and 234C doped with fluorine (F) 238 may help to improve some parameters of the wafer acceptance test (WAT), such as off-state current (Ioff) (leakage current) and breakdown voltage (BVD), of the resulting FinFET. After performing the pre-cleaning process 362, the barrier layers 234A, 234B and 234C include fluorine (F) 238 within.

In some embodiments, the pre-cleaning process 362 includes a plasma pre-cleaning process. The pre-cleaning process 362 may be performed using the process gas including hydrofluoric acid (HF), $NF_3$, $NH_3$ and He. The pre-cleaning process 362 may be performed at a temperature in a range from about 30° C. to about 300° C. In addition, the etching process 361 may be performed with a radio-frequency (RF) power in a range from about 100 W to about 1000 W.

Afterward, portions of the dielectric layer 226 above the metal gate structures 256A and 256B are removed to form openings 239A and 239B by a patterning process, as shown in FIG. 2E in accordance with some embodiments. The opening 239A may be formed through the dielectric layer 226 and exposes the metal gate structure 256A. In addition, the patterning process is performed to remove a portion of the barrier layer 234B and a portion of the dielectric layer 226 above the metal gate structure 256B. Therefore, the opening 234B (FIG. 2D) may be enlarged to form the opening 239B by the patterning process. A barrier layer 235B may be formed on a portion of a sidewall 237B of the opening 239B. Furthermore, the opening 239B is formed through the dielectric layer 226 and exposes the top surface 320B of the source/drain structure 220B and the metal gate structure 256B. It should be noted that a sidewall 237A of the opening 239A directly above the metal gate structure 256A and a portion of the sidewall 237B of the opening 239B directly above the metal gate structure 256B are not covered by the barrier layer.

In some embodiments, the patterning process includes a photolithography process and a subsequent etching process. The photolithography process may include photoresist coating (e.g. spin-on coating), soft baking, mask aligning, exposure, post-exposure baking, developing the photoresist, rinsing and drying (e.g. hard baking). The etching process may include a dry etching process or a wet etching process.

Figure 2F:
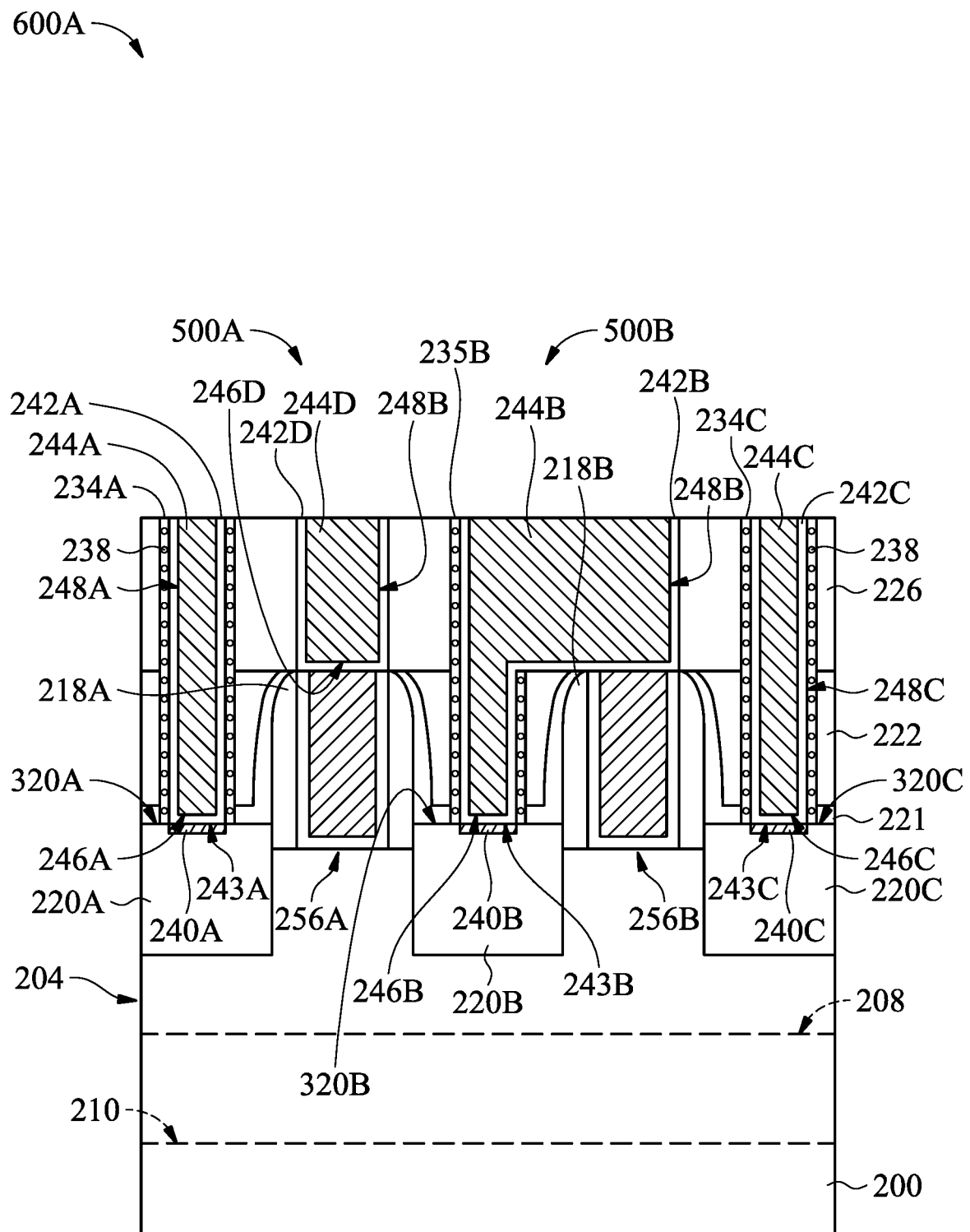

Afterward, source/drain silicide layers 240A, 240B and 240C are formed on the source/drain structures 220A, 220B and 220C by a silicidation process, as shown in FIG. 2F in accordance with some embodiments. In some embodiments, the silicidation process includes a metal material deposition process and an annealing process performed in sequence. In some embodiments, the deposition process of the silicidation process includes a physical vapor deposition (PVD) process, an atomic layer deposition (ALD) process, or another applicable process. In some embodiments, the annealing process of the silicidation process is performed at a temperature in a range from about 300° C. to about 800° C. After the annealing process, the unreacted metal material is removed.

In some embodiments, the source/drain silicide layers 240A, 240B and 240C are formed of one or more of cobalt silicide (e.g. CoSi, $CoSi_2$, $Co_2Si$, $Co_2Si$, $Co_3Si$; collectively "Co silicide"), titanium silicide (e.g. $Ti_5Si_3$, TiSi, $TiSi_2$, $TiSi_3$, $Ti_6Si_4$; collectively "Ti silicide"), nickel silicide (e.g. $Ni_3Si$, $Ni_{31}S_{112}$, $Ni_2Si$, $Ni_3Si_2$, NiSi, $NiSi_2$; collectively "Ni silicide"), copper silicide (e.g. $Cu_{17}Si_3$, $Cu_{56}Si_{11}$, $Cu_5Si$, $Cu_{33}Si_7$, $Cu_4Si$, $Cu_{19}Si_6$, $Cu_3Si$, $Cu_{87}Si_{13}$; collectively "Cu silicide"), tungsten silicide ($W_5Si_3$, $WSi_2$; collectively "W silicide"), and molybdenum silicide ($Mo_3Si$, $Mo_5Si_3$, $MoSi_2$; collectively "Mo silicide").

Afterward, glue layers 242A, 242B, 242C and 242D are formed covering the sidewall surfaces of the openings 232A, 239B, 232C and 239A. The glue layers 242A, 242B and 242C are formed covering the source/drain structures 220A, 220B and 220C in the openings 232A, 239B and 232C (FIG. 2E), as shown in FIG. 2F in accordance with some embodiments. In addition, contact structures 244A, 244B, 244C and 244D are formed filling the openings 232A, 239B, 239A and 232C. The contact structures 244A, 244B and 244C are formed passing through the dielectric layers 222 and 226, and the contact structure 244D is formed passing through the dielectric layer 226.

As shown in FIG. 2F, the glue layer 242A may be conformally formed over the source/drain silicide layer 240A and lines the sidewall 233A and a bottom of the opening 232A. The glue layer 242B may be conformally formed over the source/drain silicide layer 240B and lines the sidewall 237A and a bottom of the opening 239B. The glue layer 242C may be conformally formed over the source/drain silicide layer 240C and the metal gate structure 256B and lines the sidewall 233C and a bottom of the opening 232C. The glue layer 242D may be conformally formed over the metal gate structure 256A and lines the sidewall 237A and a bottom of the opening 239B. In some embodiments, bottom surfaces 243A, 243B and 243C of the glue layers 242A, 242B and 242C are respectively exposed to the barrier layers 234A, 235B and 234C. In addition, the bottom surfaces 243A, 243B and 243C of the glue layers 242A, 242B and 242C are not covered by the barrier layers 234A, 235B and 234C. The bottom surfaces 243A, 243B and 243C of the glue layers 242A, 242B and 242C are respectively in direct contact with the source/drain silicide layers 240A, 240B and 240C. Furthermore, the bottom surfaces 243A, 243B and 243C of the glue layers 242A, 242B and 242C are respectively level with the top surfaces 320A, 320B and 320C of the source/drain structures 220A, 220B and 220C.

As shown in FIG. 2F, the contact structures 244A, 244B, 244C and 244D are surrounded by the glue layers 242A, 242B, 242C and 242D, respectively. The contact structures 244A, 244B, 244C and 244D are surrounded by the dielectric layers 222 and 226. The contact structure 244D is surrounded by the dielectric layer 226. A bottom surface 246A and a sidewall surface 248A of the contact structure 244A may be covered by the glue layer 242A. A bottom surface 246B and a sidewall surface 248B of the contact structure 244B may be covered by the glue layer 242B. A bottom surface 246C and a sidewall surface 248C of the contact structure 244C may be covered by the glue layer 242C. A bottom surface 246D and a sidewall surface 248D of the contact structure 244D may be covered by the glue layer 242D. In addition, the contact structure 244A is formed over the source/drain structure 220A. The contact structure 244B is formed over the source/drain structure 220B and the metal gate structure 256B. The contact structure 244C is formed over the source/drain structure 220C. The contact structure 244D is formed over the metal gate structure 256A. Furthermore, the bottom surfaces 246A, 246B and 246C of the contact structures 244A, 244B and 244C may be electrically connected to the source/drain structures 220A, 220B and 220C through the glue layers 242A, 242B and 242C, respectively. The bottom surface 246D of the contact structure 244D may be electrically connected to the metal gate structure 256A. It should be noted that the barrier layers 234A, 235B and 234C are not formed sandwiched between the bottom surfaces 246A, 246B and 246C of the contact structures 244A, 244B and 244C and the source/drain structures 220A, 220B and 220C.

As shown in FIG. 2F, the contact structures 244A and 244C may serve as source/drain contact structures. The contact structure 244B may serve as a slot contact structure formed by merging the source/drain contact structure and the gate contact structure. In addition, the contact structure 244D may serve as a gate contact structure.

In some embodiments, the glue layers 242A, 242B, 242C and 242D and the contact structures 244A, 244B and 244C and 244D by deposition processes and a subsequent planarization process such as CMP. The glue layers 242A, 242B, 242C and 242D may include an electrically conductive material such as titanium (Ti), titanium nitride (TiN), tantalum (Ta), tantalum nitride (TaN), or the like, and may be formed by a CVD process, such as plasma-enhanced CVD (PECVD). However, other alternative processes, such as sputtering or metal organic chemical vapor deposition (MOCVD), physical vapor deposition (PVD), atomic layer deposition (ALD), may also be used. The contact structures 244A, 244B and 244C and 244D may be made of a conductive material, such as copper (Cu), aluminum (Al), tungsten (W), titanium (Ti), titanium nitride (TiN), tantalum (Ta), tantalum nitride (TaN), or another applicable material, and may be formed by any suitable deposition method, such as PVD, CVD, ALD, plating (e.g. electroplating).

After performing the aforementioned processes, a FinFET 500A and a FinFET 500B are formed over the fin structure 204. Moreover, a semiconductor structure 600A including the FinFET 500A and the FinFET 500B is formed, as shown in FIG. 2F in accordance with some embodiments.

In some embodiments, the semiconductor structure 600A includes the barrier layers 234A, 234C and 235B encircling the sidewall surfaces 248A, 248B and 248C of the contact structures 244A, 244B and 244C, which are electrically connected to the source/drain structures 220A, 220B and 220C. In some embodiments, the band gap value of the barrier layers 234A, 234C and 235B is from about 4 eV to about 9 eV, which is greater than the band gap values of the gate spacers 218A and 218B, the CESL 221, and the dielectric layers 222 and 226. Therefore, the barrier layers 234A, 234C and 235B may provide better insulation between the source/drain structures 220A, 220B and 220C and the metal gate structures 256A and 256B of the FinFETs 500A and 500B. In some embodiments, the barrier layers may be doped with fluorine (F) by the pre-cleaning process performed prior to the formation of the contact structure. Therefore, the leakage problem between the source/drain contact structure and the metal gate structure of the FinFET may be eliminated. Some parameters of the wafer acceptance test (WAT), such as off-state current (Ioff) (leakage current) and breakdown voltage (BVD), of the FinFET may be improved.

Figure 3:
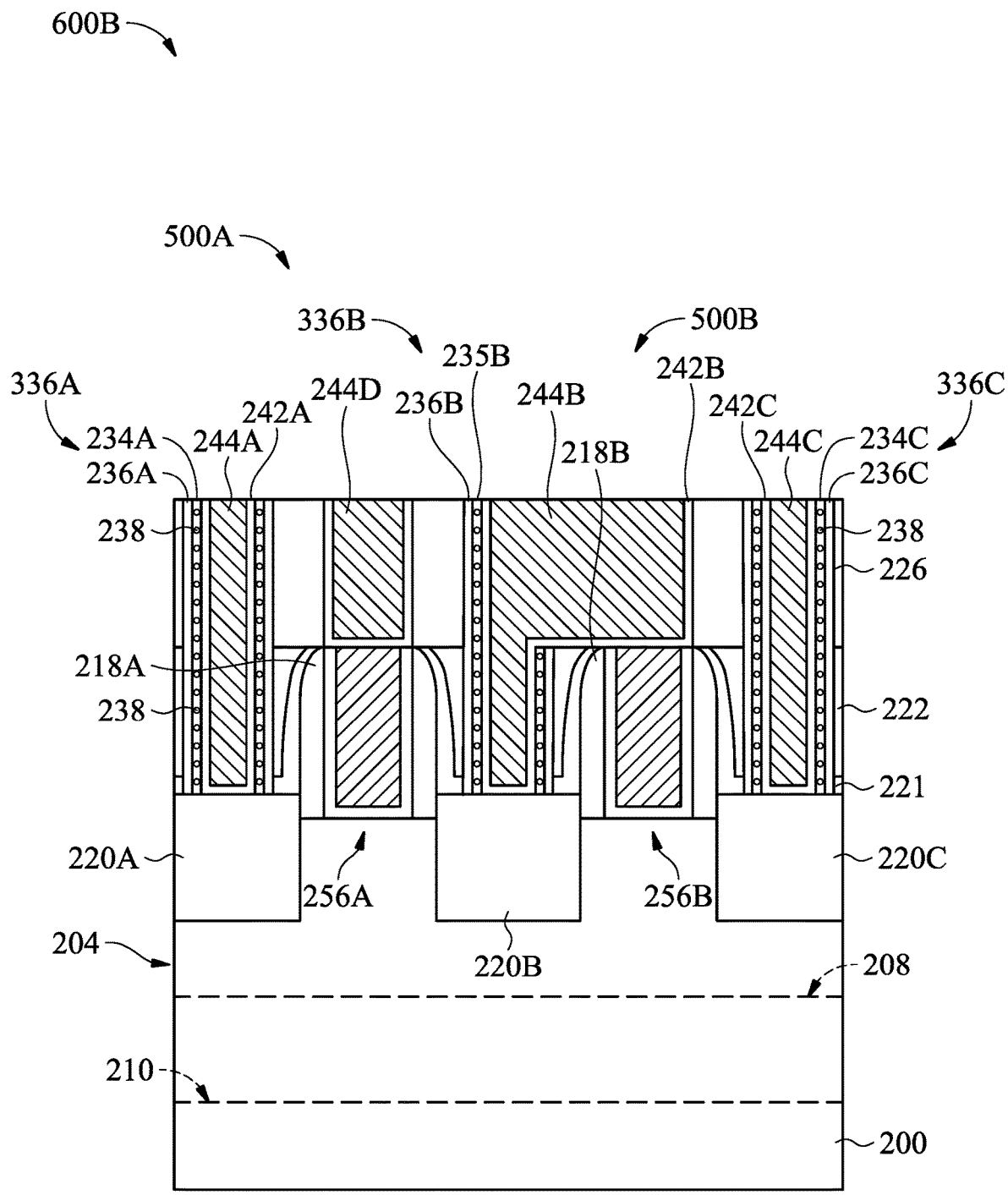
FIG. 3 is a cross-sectional view of a semiconductor structure, in accordance with some embodiments.

FIG. 3 is a cross-sectional view of a semiconductor structure 600B, in accordance with some embodiments. The materials, configurations, structures and/or processes of the semiconductor structure 600B may be similar to, or the same as, those of the semiconductor structure 600A, and the details thereof are not repeated herein. One of the differences between the semiconductor device structure 600A and the semiconductor device structure 600B is that the semiconductor device structure 600B further includes an additional barrier layer 236A, 236B and 236C. More specifically, barrier layer structures 336A, 336B and 336C are located between the dielectric layer 222 (or the dielectric layer 226) and the glue layer 242A, 242B and 242C and encircle the sidewalls of the corresponding contact structures 244A, 244B and 244C. In some embodiments, the barrier layer structures 336A, 336B and 336C are multi-layer structures respectively encircling the sidewalls of the corresponding contact structures 244A, 244B and 244C. For example, the barrier layer structure 336A may include the barrier layer 234A and a barrier layer 236A surrounding the barrier layer 234A. The barrier layer structure 336B may include the barrier layer 234B and a barrier layer 236B surrounding the barrier layer 235B. In addition, the barrier layer structure 336C may include the barrier layer 234C and a barrier layer 236C surrounding the barrier layer 234C. In some embodiments, the materials, configurations, structures and/or processes of the barrier layers 236A, 236B and 236C may be similar to, or the same as, those of the barrier layers 234A, 235B and 234C. For example, the barrier layers 236A, 236B and 236C may be formed of materials with the band gap value in a range from about 4 eV to about 9 eV. In some other embodiments, the band gap values of the barrier layers 236A, 236B and 236C may be may be similar to, or the same as, the band gap values of the gate spacers 218A and 218B, the CESL 221, and the dielectric layers 222 and 226. In some embodiments, the fluorine (F) 238 may be doped in the barrier layers 236A, 236B and 236C.

Figure 4:
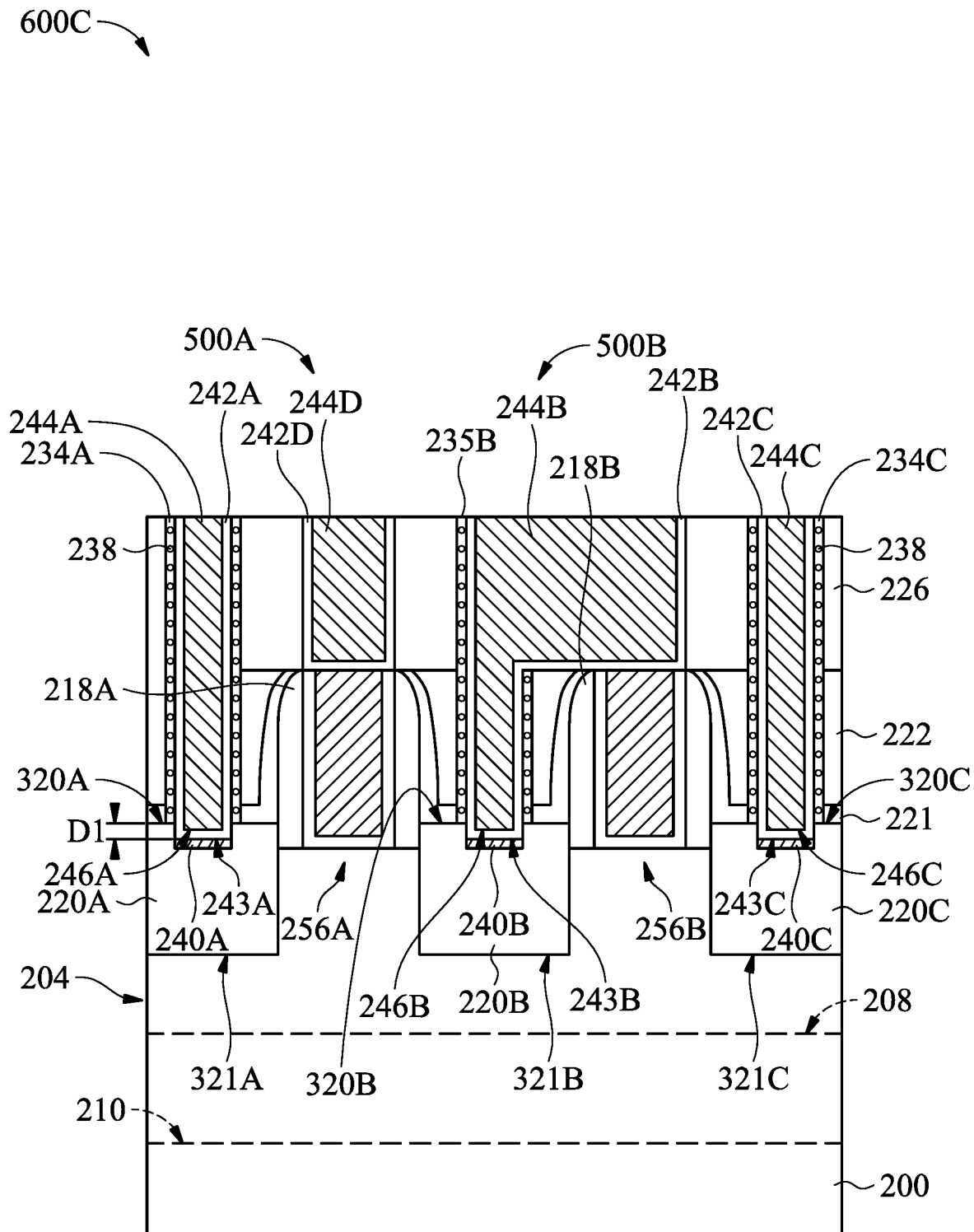
FIG. 4 is a cross-sectional view of a semiconductor structure, in accordance with some embodiments.

FIG. 4 is a cross-sectional view of a semiconductor structure 600C, in accordance with some embodiments. The materials, configurations, structures and/or processes of the semiconductor structure 600C may be similar to, or the same as, those of the semiconductor structure 600A, and the details thereof are not repeated herein. One of the differences between the semiconductor device structure 600A and the semiconductor device structure 600C is that a bottom surface of the glue layer of the semiconductor device structure 600C is located lower than the top surface of the source/drain structure. More specifically, the source/drain structure is connected to the glue layer through the source/drain silicide layer. A bottom surface of the glue layer of the semiconductor device structure 600C is positioned between the top surface and the bottom surface of the source/drain structure (or embedded in the source/drain structure). Therefore, the bottom surface and a portion of the sidewall surface of the glue layer are surrounded by the corresponding source/drain structure.

For example, the bottom surface 243A of the glue layer 242A is positioned between the top surface 320A and a bottom surface 321A of the source/drain structure 220A connecting to the glue layer 242A. The bottom surface 243B of the glue layer 242B is positioned between the top surface 320B and a bottom surface 321B of the source/drain structure 220B connecting to the glue layer 242B. The bottom surface 243C of the glue layer 242C is positioned between the top surface 320C and a bottom surface 321C of the source/drain structure 220C connecting to the glue layer 242C. In addition, the bottom surfaces 243A, 243B and 243C of the glue layers 242A, 242B and 242C may be embedded in the source/drain structures 220A, 220B and 220C. In some embodiments, the bottom surfaces 243A, 243B and 243C of the glue layers 242A, 242B and 242C are lower than the top surfaces 320A, 320B and 320C of the source/drain structures 220A, 220B and 220C by a distance D1 shown in FIG. 4. In some embodiments, the bottom surfaces 243A, 243B and 243C of the glue layers 242A, 242B and 242C are lower than bottom surfaces of the barrier layers 236A, 236B and 236C (the bottom surfaces of the barrier layers 236A, 236B and 236C are level with the top surfaces 320A, 320B and 320C of the source/drain structures 220A, 220B and 220C).

Figure 5:
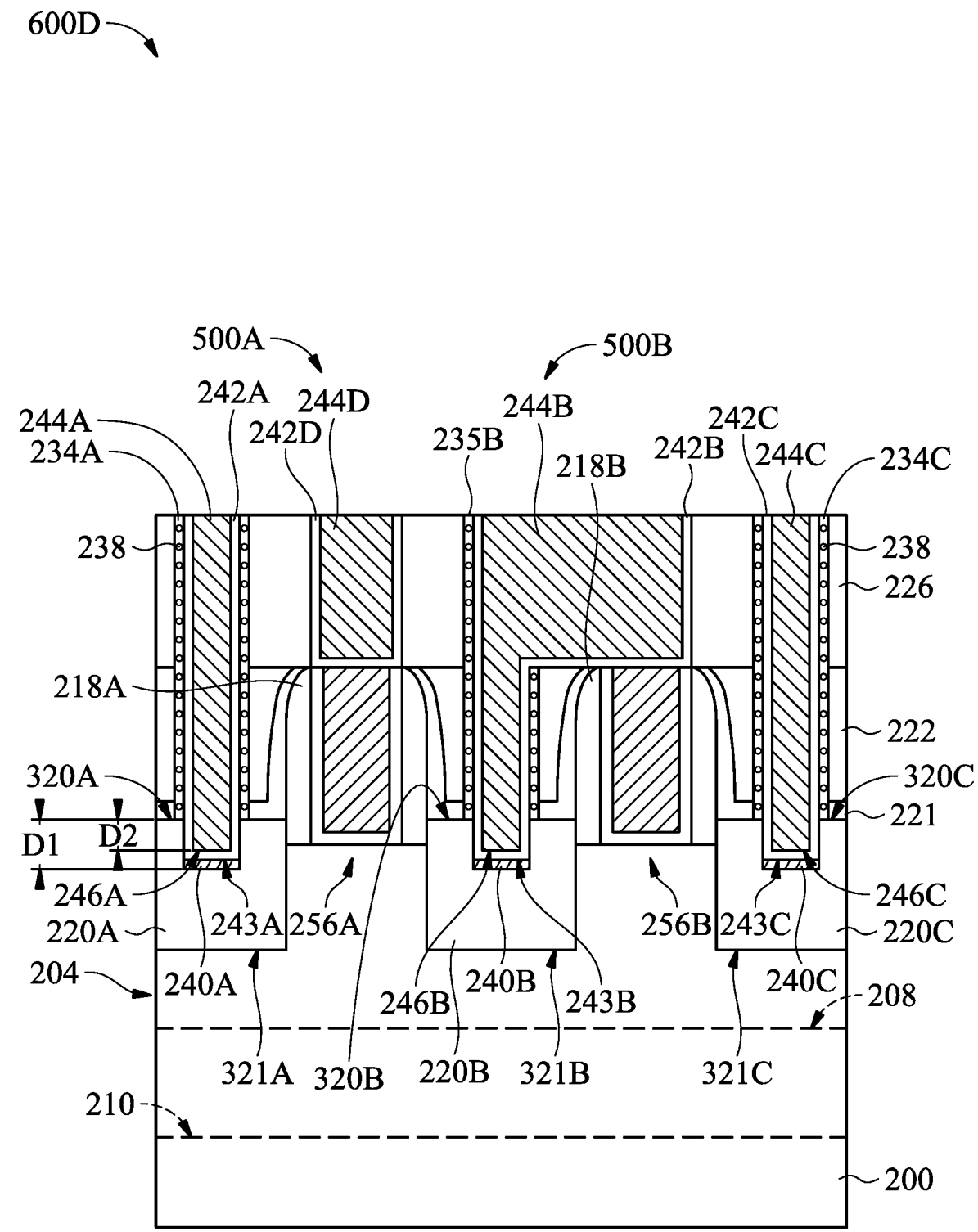
FIG. 5 is a cross-sectional view of a semiconductor structure, in accordance with some embodiments.

FIG. 5 is a cross-sectional view of a semiconductor structure 600D, in accordance with some embodiments. The materials, configurations, structures and/or processes of the semiconductor structure 600D may be similar to, or the same as, those of the semiconductor structure 600C, and the details thereof are not repeated herein. One of the differences between the semiconductor device structure 600C and the semiconductor device structure 600D is that a bottom surface of the contact structure of the semiconductor device structure 600C is located lower than the top surface of the source/drain structure. More specifically, the bottom surface of the contact structure of the semiconductor device structure 600D is positioned between the top surface and the bottom surface of the source/drain structure (or embedded in the source/drain structure). The source/drain structure is connected to the glue layer through the source/drain silicide layer. Therefore, the bottom surface and a portion of the sidewall surface of the contact structure are surrounded by the corresponding source/drain structure.

For example, the bottom surface 246A of the contact structure 244A is positioned between the top surface 320A and the bottom surface 321A of the source/drain structure 220A. The bottom surface 246B of the contact structure 244B is positioned between the top surface 320B and the bottom surface 321B of the source/drain structure 220B. The bottom surface 246C of the contact structure 244C is positioned between the top surface 320C and the bottom surface 321C of the source/drain structure 220C. In addition, the bottom surfaces 246A, 246B and 246C of the contact structures 244A, 244B and 244C may be embedded in the source/drain structures 220A, 220B and 220C. In some embodiments, the bottom surfaces 246A, 246B and 246C of the contact structures 244A, 244B and 244C are lower than the top surfaces 320A, 320B and 320C of the source/drain structures 220A, 220B and 220C by a distance D2 that is less than the distance D1 shown in FIG. 5.

The semiconductor structures 600B, 600C and 600D include the barrier layers 234A, 234C and 235B encircling the contact structures 244A, 244B and 244C. In addition, the barrier layers 234A, 234C and 235B are located between the contact structures 244A, 244B and 244C and the metal gate structures 256A and 256B along the longitudinal direction (the channel length direction of the FinFETs 500A and 500B) of the fin structure 204 of the semiconductor structures 600B, 600C and 600D. In some embodiments, the band gap value of the barrier layers 234A, 234C and 235B is from about 4 eV to about 9 eV to provide better insulation between the source/drain structures 220A, 220B and 220C and the metal gate structures 256A and 256B of the FinFETs 500A and 500B. In some embodiments, the barrier layers may be doped with fluorine (F) by the pre-cleaning process performed prior to the formation of the contact structure. Some parameters of the wafer acceptance test (WAT), such as off-state current (Ioff) (leakage current) and breakdown voltage (BVD), of the FinFET may be improved.

Figure 6A:
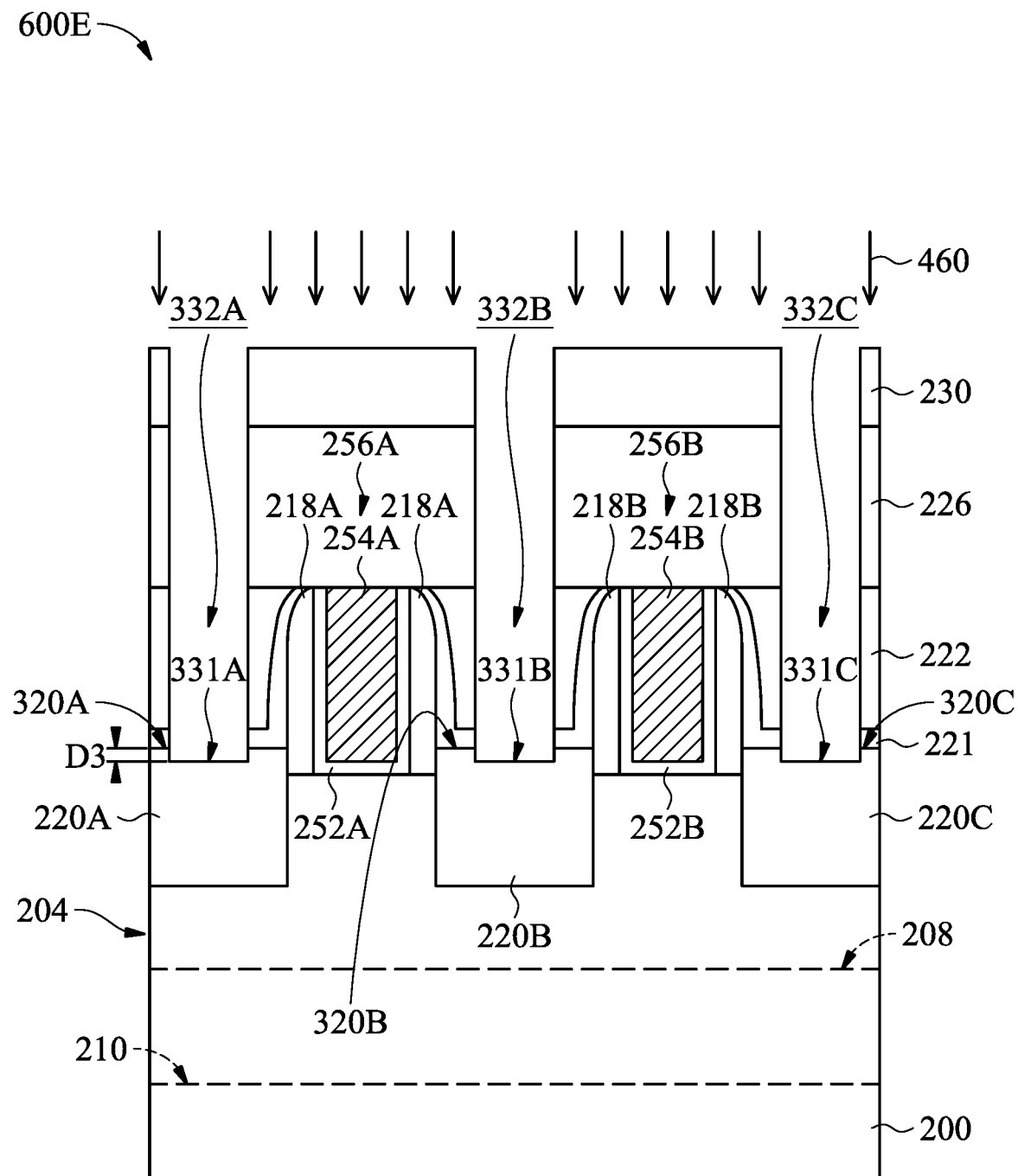
FIGS. 6A-6C are cross-sectional views of various stages of a process for forming a semiconductor structure, in accordance with some embodiments.
Figure 6B:
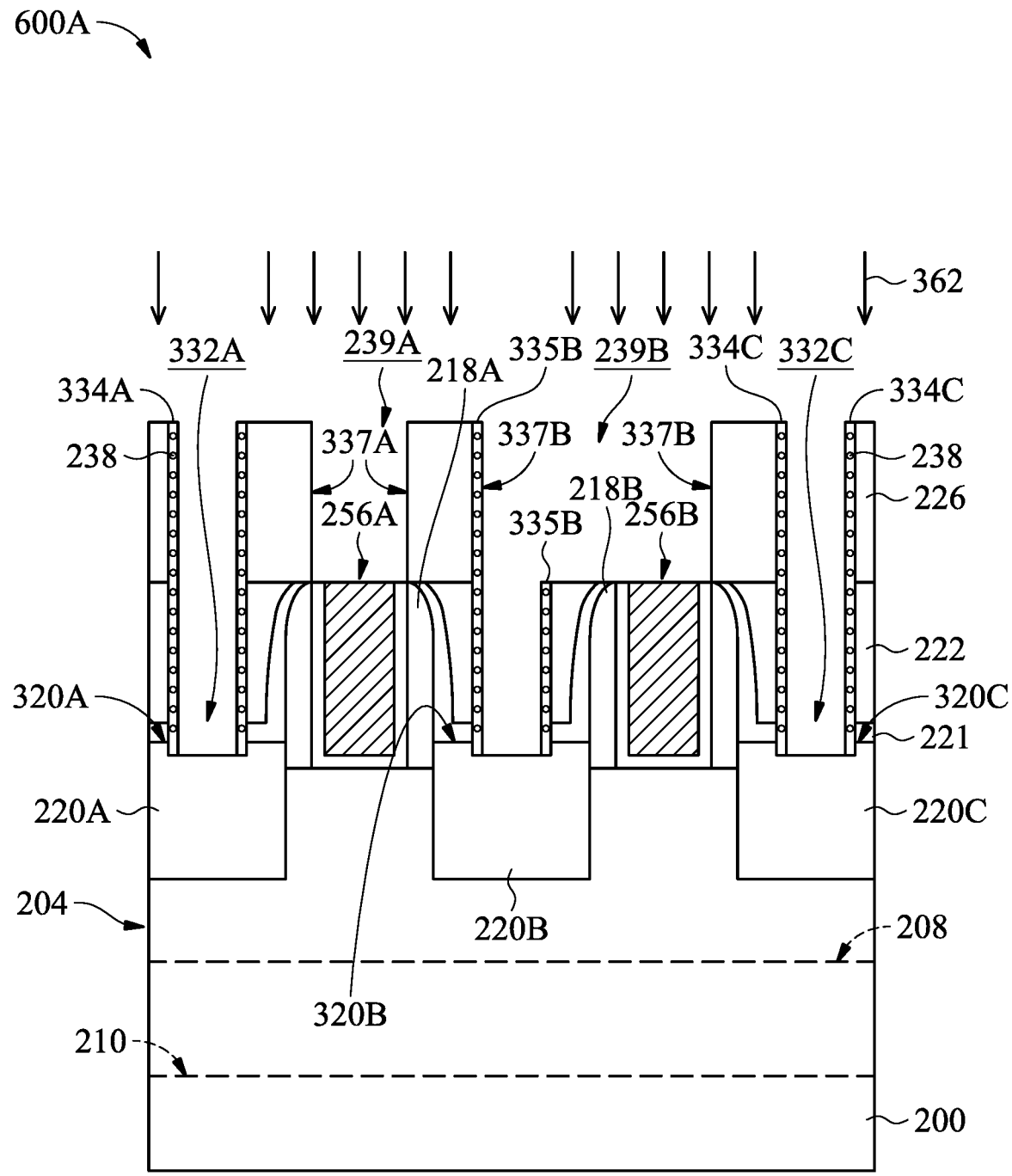
Figure 6C:
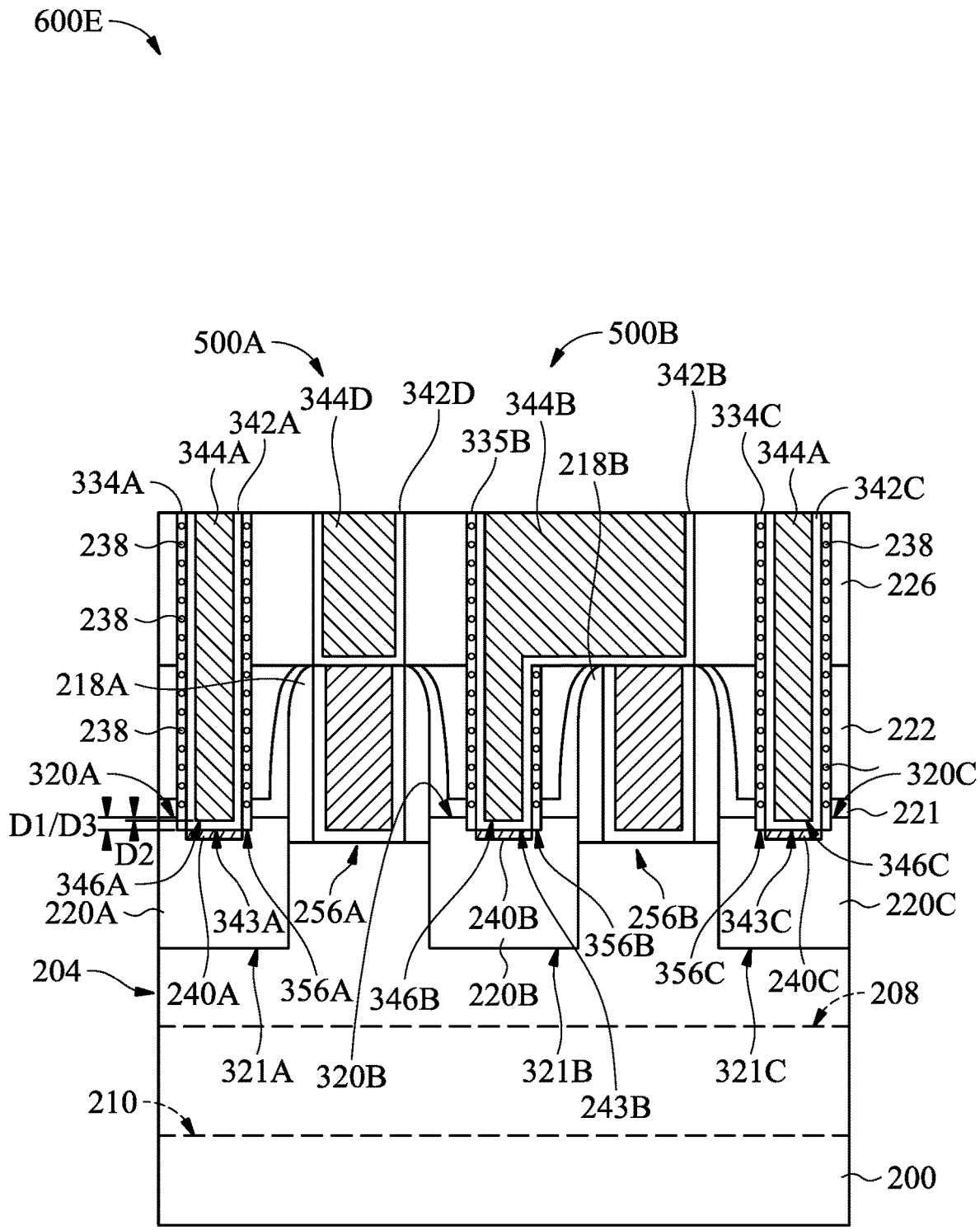

FIGS. 6A-6C are cross-sectional views of various stages of a process for forming the semiconductor structure 600E after performing the stage shown in FIG. 2A, in accordance with some embodiments. The materials, configurations, structures and/or processes of the semiconductor structure 600E may be similar to, or the same as, those of the semiconductor structure 600A, and the details thereof are not repeated herein.

After the dielectric layer 226 is formed, a mask layer 230 is formed over the dielectric layer 226, as shown in FIG. 6A in accordance with some embodiments. The materials, configurations, structures and/or processes of the mask layer 230 shown in FIG. 6A may be similar to, or the same as, those of the mask layer 230 shown in FIG. 1B, and the details thereof are not repeated herein.

Afterward, an etching process 460 is performed to form openings 332A, 332B and 332C in the dielectric layers 222 and 226 and in a portion of the source/drain structures 220A, 220B and 220C, as shown in FIG. 6A in accordance with some embodiments. The etching process 460 is performed to remove portions of the dielectric layers 222 and 226, the CESL 221 and the source/drain structures 220A, 220B and 220C to form the openings 332A, 332B and 332C. Therefore, the openings 332A, 332B and 332C may be formed passing through the dielectric layers 222 and 226 and the CESL 221. In addition, bottom surfaces 331A, 331B and 331C of the openings 332A, 332B and 332C may be positioned lower than the top surfaces 320A, 320B and 320C of the source/drain structures 220A, 220B and 220C by a distance D3 shown in FIG. 6A. In some embodiments, etching gases used in the etching process 460 include fluorine-containing (F-containing) gases.

Afterward, a barrier layer (not shown) is deposited lining sidewall surfaces and bottom surfaces of the openings 332A, 332B and 332C. The barrier layer may be conformally formed over the dielectric layers 222 and 226 and the source/drain structures 220A, 220B and 220C. The materials, configurations, structures and/or processes of the barrier layer may be similar to, or the same as, those of the barrier layer 234 shown in FIG. 2C, and the details thereof are not repeated herein.

Afterward, a portion of the barrier layer is etched to expose the source/drain structures 220A, 220B and 220C by an etching process. The etching process is performed to remove a portion of the barrier layer above a top surface of the dielectric layer 226 and portions the source/drain structures 220A, 220B and 220C in the openings 332A, 332B and 332C and to stop on the source/drain structures 220A, 220B and 220C. The methods and/or conditions of the etching process may be similar to, or the same as, those of the etching process 361 shown in FIG. 2D, and the details thereof are not repeated herein. After the etching process is performed, the source/drain structures 220A, 220B and 220C in the openings 332A, 332B and 332C are exposed.

Afterward, a pre-cleaning process 362 is performed on barrier layers 334A, and 334C in the openings 332A and 332C. In addition, the pre-cleaning process 362 is performed on a barrier layer above the source/drain structure 220B, as shown in FIG. 6B in accordance with some embodiments. In some embodiments, the pre-cleaning process 362 is performed to dope the barrier layers with fluorine (F) 238 on sidewalls of the barrier layers in the openings 332A, 332B and 332C (FIG. 6A). The methods and/or conditions of the pre-cleaning process 362 shown in FIG. 6B may be similar to, or the same as, those of the pre-cleaning process 362 shown in FIG. 2E, and the details thereof are not repeated herein. After performing the pre-cleaning process 362, the barrier layers 334A and 334C and the barrier layer above the source/drain structure 220B include fluorine (F) 238 within.

Afterward, portions of the dielectric layer 226 above the metal gate structures 256A and 256B are removed to form openings 339A and 339B by a patterning process, as shown in FIG. 6B in accordance with some embodiments. The opening 339A may be formed through the dielectric layer 226 and exposes the metal gate structure 256A. In addition, the patterning process is performed to remove a portion of the barrier layer 334B and a portion of the dielectric layer 226 above the metal gate structure 256B. Therefore, the opening 332B (FIG. 6A) may be enlarged to form the opening 339B using a patterning process. Therefore, a barrier layer 335B is formed on a portion of a sidewall 337B of the opening 339B. Furthermore, the opening 339B is formed through the dielectric layer 226 and exposes the source/drain structure 220B and a top surface of the metal gate structure 256B. It should be noted that a sidewall 337A of the opening 339A directly above the metal gate structure 256A and a portion of the sidewall 337B of the opening 339B directly above the metal gate structure 256B are not covered by the barrier layer.

Afterward, source/drain silicide layers 240A, 240B and 240C are formed on the source/drain structures 220A, 220B and 220C. Glue layers 342A, 342B, 342C and 342D are formed covering the sidewall surfaces of the openings 332A, 339A, 339B and 332C and the source/drain structures 220A, 220B and 220C in the openings 332A, 339B and 332C (FIG. 6B). In addition, contact structures 344A, 344B and 344C and 344D are formed filling the openings 332A, 339A, 339B and 332C passing through the dielectric layers 222 and 226, as shown in FIG. 6C in accordance with some embodiments. The materials, configurations, structures and/or processes of the source/drain silicide layers 240A, 240B and 240C, the glue layers 342A, 342B, 342C and 342D and the contact structures 344A, 344B, 344C and 344D, shown in FIG. 6C may be similar to, or the same as, those of the source/drain silicide layers 240A, 240B and 240C, the glue layers 242A, 242B, 242C and 242D and the contact structures 244A, 244B and 244C and 244D shown in FIG. 2F, and the details thereof are not repeated herein.

In some embodiments, portions of the barrier layers 334A, 335B and 334C, portions of the glue layers 342A, 342B and 342C and portions of the contact structures 344A, 344B and 344C are embedded in the source/drain structures 220A, 220B and 220C. Bottom surfaces 343A, 343B and 343C of the glue layers 342A, 342B and 342C are positioned lower than the top surfaces 320A, 320B and 320C of the source/drain structures 220A, 220B and 220C by the distance D1. Bottom surfaces 346A, 346B and 346C of the contact structures 344A, 344B and 344C are lower than the top surfaces 320A, 320B and 320C of the source/drain structures 220A, 220B and 220C by the distance D2. In addition, bottom surfaces 356A, 356B and 356C of the barrier layers 334A, 335B and 334C are positioned lower than the top surfaces 320A, 320B and 320C of the source/drain structures 220A, 220B and 220C by a distance D3. The bottom surfaces 356A, 356B and 356C of the barrier layers 334A, 335B and 334C may be embedded in the source/drain structures 220A, 220B and 220C. In some embodiments shown in FIG. 5C, the distance D1 is equal to the distance D3 and greater than the distance D2. The bottom surfaces 356A, 356B and 356C of the barrier layers 334A, 335B and 334C are aligned the bottom surfaces 343A, 343B and 343C of the glue layers 342A, 342B and 342C.

After performing the aforementioned processes, the semiconductor structure 600E including the FinFET 500A and the FinFET 500B is formed, as shown in FIG. 6C in accordance with some embodiments.

Figure 7:
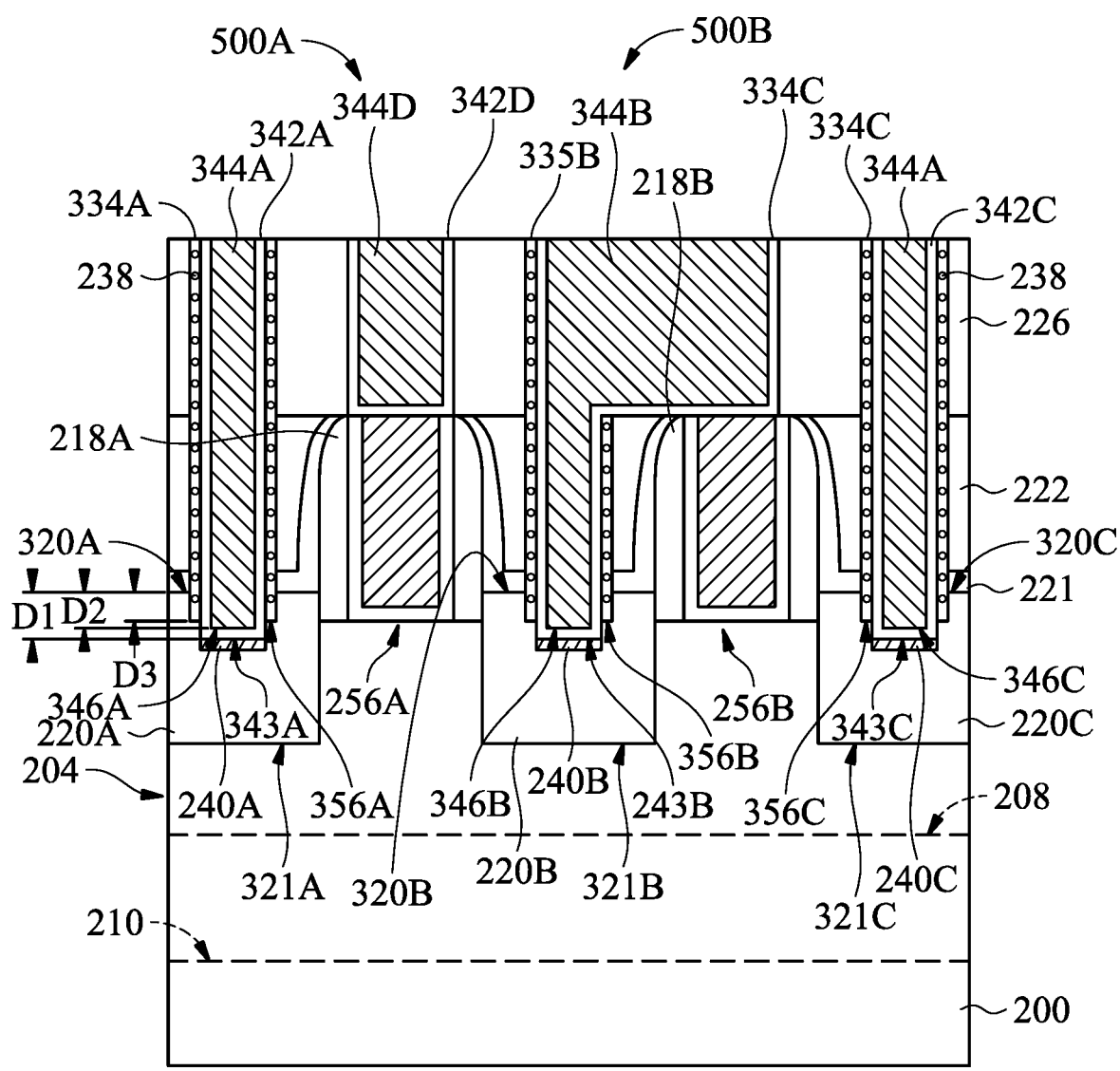
FIG. 7 is a cross-sectional view of a semiconductor structure, in accordance with some embodiments.

FIG. 7 is a cross-sectional view of a semiconductor structure 600F, in accordance with some embodiments. The materials, configurations, structures and/or processes of the semiconductor structure 600F may be similar to, or the same as, those of the semiconductor structure 600E, and the details thereof are not repeated herein. One of the differences between the semiconductor device structure 600E and the semiconductor device structure 600F is that the bottom surface of the glue layer of the semiconductor device structure 600F is positioned between the bottom surface of the barrier layer and the bottom surface of the source/drain structure connected to the glue layer. Therefore, the bottom surface and a portion of the sidewall surface of the glue layer are surrounded by the corresponding source/drain structure. For example, the bottom surface 343A of the glue layer 342A is positioned between the bottom surface 356A of the barrier layer 334A and the bottom surface 321A of the source/drain structure 220A connecting to the glue layer 342A. The bottom surface 243B of the glue layer 342B is positioned between the bottom surface 356B of the barrier layer 334B and the bottom surface 321B of the source/drain structure 220B connecting to the glue layer 342B. The bottom surface 343C of the glue layer 342C is positioned between the bottom surface 356C of the barrier layer 334C and the bottom surface 321C of the source/drain structure 220C connecting to the glue layer 342C. In some embodiments, distance D1 (the distance between the bottom surface of the glue layer and the top surface of the source/drain structure connecting to the glue layer) is greater than distance D3 (the distance between the bottom surface of the barrier layer and the top surface of the source/drain structure) and greater than distance D2 (the distance between the bottom surface of the contact structure and the top surface of the source/drain structure) shown in FIG. 7.

The semiconductor structures 600E and 600F include the barrier layers 334A, 334C and 335B encircling the contact structures 344A, 344B and 344C. In addition, the bottom surface 356A, 356B and 356C of is located lower than the top surface of the source/drain structure are located lower than the top surface 320A, 320B and 320C of the source/drain structures 220A, 220B and 220C. In some embodiments, the barrier layers 334A, 334C and 335B can provide better insulation between the source/drain structures 220A, 220B and 220C and the metal gate structures 256A and 256B of the FinFETs 500A and 500B. In some embodiments, the barrier layers may be doped with fluorine (F). Some parameters of the wafer acceptance test (WAT), such as off-state current (Ioff) (leakage current) and breakdown voltage (BVD), of the FinFET may be improved.

As described previously, the semiconductor structure (e.g. The semiconductor structures 600A, 600B, 600C, 600D, 600E and 600F) includes the barrier layers (e.g. The barrier layers 234A, 234C and 235B) encircling the sidewall surfaces (e.g. The sidewall surfaces 248A, 248B and 248C) of the contact structures (e.g. The contact structures 244A, 244B and 244C), which are electrically connected to the source/drain structures (e.g. The source/drain structures 220A, 220B and 220C). In some embodiments, the band gap value of the barrier layers is from about 4 eV to about 9 eV, which is greater than the band gap values of the gate spacers (e.g. The gate spacers 218A and 218B), the CESL (e.g. The CESL 221), and the dielectric layers (e.g. The dielectric layers 222 and 226). Therefore, the barrier layers may provide better insulation between the source/drain structures and the metal gate structures of the FinFETs (e.g. The FinFETs 500A and 500B). In some embodiments, the barrier layers may be doped with fluorine (F) by the pre-cleaning process (e.g. The pre-cleaning process 362) performed prior to the formation of the contact structure. Therefore, the leakage problem between the source/drain contact structure and the metal gate structure of the FinFET may be eliminated. Some parameters of the wafer acceptance test (WAT), such as off-state current (Ioff) (leakage current) and breakdown voltage (BVD), of the FinFET may be improved.

Embodiments of a semiconductor structure and a method for forming the same are provided. In some embodiments, a method for forming a semiconductor structure is provided. The method includes forming a gate structure over a fin structure. The method further includes forming a source/drain structure in the fin structure and adjacent to the gate structure. The method further includes forming a dielectric layer over the gate structure and the source/drain structure. The method further includes forming an opening in the dielectric layer to expose the source/drain structure. The method further includes depositing a barrier layer lining a sidewall surface of the opening and a top surface of the source/drain structure. The method further includes etching a portion of the barrier layer to expose the source/drain structure. The method further includes depositing a glue layer covering the sidewall surface of the opening and the source/drain structure in the opening. The method further includes forming a contact structure filling the opening in the dielectric layer. The contact structure is surrounded by the glue layer.

In some embodiments, a method for forming a semiconductor structure is provided. The method includes forming a gate structure over a fin structure. The method further includes forming a source/drain structure in the fin structure and adjacent to the gate structure. The method further includes forming a dielectric layer over the gate structure and the source/drain structure. The method further includes forming an opening in the dielectric layer to expose the source/drain structure. The method further includes depositing a barrier layer lining a sidewall surface of the opening and a top surface of the source/drain structure. The method further includes etching a portion of the barrier layer to expose the source/drain structure. The band gap value of the barrier layer is in a range from about 4 eV to about 9 eV.

In some embodiments, a method for forming a semiconductor structure is provided. The method includes forming a gate structure over a fin structure. The method further includes forming a source/drain structure in the fin structure and adjacent to the gate structure. The method further includes forming a dielectric layer over the gate structure and the source/drain structure. The method further includes forming an opening in the dielectric layer to expose the source/drain structure. The method further includes depositing a barrier layer lining a sidewall surface of the opening and a top surface of the source/drain structure. The method further includes etching a portion of the barrier layer to expose the source/drain structure. The method further includes performing a pre-cleaning process on the barrier layer. The pre-cleaning process is performed to dope the barrier layer with fluorine (F). The method further includes forming a contact structure filling the opening in the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a gate structure over a fin structure;
    forming a source/drain structure in the fin structure and adjacent to the gate structure;
    forming a dielectric layer over the gate structure and the source/drain structure;
    forming an opening in the dielectric layer to expose the source/drain structure;
    depositing a barrier layer lining a sidewall surface of the opening and a top surface of the source/drain structure;
    etching a portion of the barrier layer to expose the source/drain structure;
    depositing a glue layer covering the sidewall surface of the opening and the source/drain structure in the opening; and
    forming a contact structure filling the opening in the dielectric layer, wherein the contact structure is surrounded by the glue layer;
    wherein the glue layer has an extending portion in direct contact with the gate structure.

2. The method for forming a semiconductor structure as claimed in claim 1, further comprising:
    removing a portion of the dielectric layer and a portion of source/drain structure during formation of the opening.

3. The method for forming a semiconductor structure as claimed in claim 1, further comprising:
    performing a pre-cleaning process on the barrier layer, wherein the pre-cleaning process is performed to dope the barrier layer with fluorine (F) before forming the contact structure filling the opening.

4. The method for forming a semiconductor structure as claimed in claim 1, wherein a bottom surface of the glue layer is leveled with a top surface of the source/drain structure.

5. The method for forming a semiconductor structure as claimed in claim 1, wherein a top surface of the barrier layer is leveled with a top surface of the gate structure.

6. The method for forming a semiconductor structure as claimed in claim 1, wherein the glue layer covers an interface between the barrier layer and the dielectric layer.

7. The method for forming a semiconductor structure as claimed in claim 1, further comprising:
    performing a silicidation process to form a source/drain silicide layer on the source/drain structure.

8. The method for forming a semiconductor structure as claimed in claim 1, further comprising:
    depositing an additional barrier layer, wherein the barrier layer and the additional barrier layer form a multi-layer barrier layer structure between the dielectric layer and the glue layer and encircling a sidewall of the contact structure.

9. A method for forming a semiconductor structure, comprising:
    forming a gate structure over a fin structure;
    forming a source/drain structure in the fin structure and adjacent to the gate structure;
    forming a dielectric layer over the gate structure and the source/drain structure;
    forming an opening in the dielectric layer to expose the source/drain structure;
    depositing a barrier layer lining a sidewall surface of the opening and a top surface of the source/drain structure;
    etching a portion of the barrier layer to expose the source/drain structure; and
    depositing a glue layer covering the sidewall surface of the opening, the source/drain structure in the opening, a top surface of the barrier layer, and a top surface of the gate structure;
    wherein a band gap value of the barrier layer is in a range from about 4 eV to about 9 eV.

10. The method for forming a semiconductor structure as claimed in claim 9, further comprising: forming a contact structure filling the opening in the dielectric layer, wherein the contact structure is surrounded by the glue layer.

11. The method for forming a semiconductor structure as claimed in claim 10, wherein a bottom surface of the glue layer is leveled with the top surface of the source/drain structure.

12. The method for forming a semiconductor structure as claimed in claim 10, wherein a bottom surface of the glue layer is located lower than the top surface of the source/drain structure.

13. The method for forming a semiconductor structure as claimed in claim 12, wherein the bottom surface of the glue layer is located between the top surface and a bottom surface of the source/drain structure.

14. The method for forming a semiconductor structure as claimed in claim 9, further comprising:
    performing a pre-cleaning process on the barrier layer, wherein the pre-cleaning process is performed to dope the barrier layer with fluorine (F) before forming the contact structure filling the opening.

15. A method for forming a semiconductor structure, comprising:
- forming a gate structure over a fin structure;
- forming a source/drain structure in the fin structure and adjacent to the gate structure;
- forming a dielectric layer over the gate structure and the source/drain structure;
- forming an opening in the dielectric layer to expose the source/drain structure;
- depositing a barrier layer lining a sidewall surface of the opening and a top surface of the source/drain structure;
- etching a portion of the barrier layer to expose the source/drain structure;
- performing a pre-cleaning process on the barrier layer, wherein the pre-cleaning process is performed to dope the barrier layer with fluorine (F); and
- forming a contact structure filling the opening in the dielectric layer;
- wherein the barrier layer comprises a first part and a second part lining on different sidewall surfaces of the opening, a top surface of the second part is leveled with a top surface of the dielectric layer, and the contact structure is located above the second part of the barrier layer.

16. The method for forming a semiconductor structure as claimed in claim 15, wherein the barrier layer comprises silicon nitride, aluminium oxide, aluminium fluoride, aluminium oxyfluoride, silicon-doped zirconium oxide, silicon-doped hafnium oxide, hafnium oxide ($HfO_2$), zirconium oxide, silicon oxide or a combination thereof.

17. The method for forming a semiconductor structure as claimed in claim 15, wherein a concentration of the fluorine (F) in the barrier layer is in a range from about 2 at % to about 4 at %.

18. The method for forming a semiconductor structure as claimed in claim 15, wherein a bottom surface of the contact structure is lower than a top surface of the source/drain structure.

19. The method for forming a semiconductor structure as claimed in claim 18, wherein the bottom surface of the contact structure is between the top surface and a bottom surface of the source/drain structure.

20. The method for forming a semiconductor structure as claimed in claim 15, wherein a top surface of the first part is leveled with a top surface of the contact structure, a bottom surface of the first part is leveled with a bottom surface of the second part, and an overall length of the first part of the barrier layer is different from an overall length of the second part of the barrier layer.

* * * * *